US012757441B2

(12) United States Patent
Xie et al.

(10) Patent No.: US 12,757,441 B2
(45) Date of Patent: Oct. 6, 2026

(54) CONTACT FORMATION WITH STAGGERED GATE PATTERNING

(71) Applicant: INTERNATIONAL BUSINESS MACHINES CORPORATION, Armonk, NY (US)

(72) Inventors: Ruilong Xie, Niskayuna, NY (US); Albert M. Chu, Nashua, NH (US); Brent A. Anderson, Jericho, VT (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 432 days.

(21) Appl. No.: 18/361,845

(22) Filed: Jul. 29, 2023

(65) Prior Publication Data

US 2025/0040184 A1 Jan. 30, 2025

(51) Int. Cl.

| | |
|---|---|
| ***H10D 30/67*** | (2025.01) |
| ***H10D 30/01*** | (2025.01) |
| ***H10D 30/43*** | (2025.01) |
| ***H10D 62/10*** | (2025.01) |
| ***H10D 64/01*** | (2025.01) |

(Continued)

(52) U.S. Cl.

CPC ....... *H10D 30/6729* (2025.01); *H10D 30/014* (2025.01); *H10D 30/43* (2025.01); *H10D 30/6735* (2025.01); *H10D 30/6757* (2025.01); *H10D 62/121* (2025.01); *H10D 64/017* (2025.01); *H10D 64/021* (2025.01); *H10D 84/0128* (2025.01); *H10D 84/013* (2025.01); *H10D 84/0147* (2025.01); *H10D 84/0149* (2025.01); *H10D 84/038* (2025.01); *H10D 84/83* (2025.01); *H10W 20/20* (2026.01)

(58) Field of Classification Search

CPC .. H10D 30/6729; H10D 30/673; H10D 89/10; H10D 30/62; H10D 30/43; H10D 62/121; H10D 30/6735; H10W 20/081; H10W 20/074

See application file for complete search history.

(56) References Cited

U.S. PATENT DOCUMENTS

| | | | |
|---|---|---|---|
| 11,437,283 | B2 | 9/2022 | Lilak |
| 11,616,053 | B2 | 3/2023 | Smith |

(Continued)

FOREIGN PATENT DOCUMENTS

| | | | |
|---|---|---|---|
| WO | 2022119621 | A1 | 6/2022 |

OTHER PUBLICATIONS

Horiguchi et al.; "Backside Power Delivery: How to power chips from the Backside: Benefits and building blocks of a backside power delivery network" https://www.imec-int.com/en/articles/how-power-chips-backside (Year: 2022).*

*Primary Examiner* — Britt Hanley
*Assistant Examiner* — Jason James Greaving
(74) *Attorney, Agent, or Firm* — Samuel A. Waldbaum

(57) ABSTRACT

A semiconductor device includes a plurality of gate caps over a plurality of gate regions, gate spacers over sidewalls of the plurality of gate regions and the plurality of gate caps, a backside contact under a first source and drain region and a dielectric cap over the first source and drain region. The first source and drain region is located between two adjacent gate regions of the plurality of gate regions.

18 Claims, 22 Drawing Sheets

(51) Int. Cl.

| | |
|---|---|
| ***H10D 84/01*** | (2026.01) |
| ***H10D 84/03*** | (2025.01) |
| ***H10D 84/83*** | (2025.01) |
| ***H10W 20/20*** | (2026.01) |

(56) References Cited

U.S. PATENT DOCUMENTS

| | | | |
|---|---|---|---|
| 2021/0111115 A1 | 4/2021 | Morrow et al. | |
| 2021/0134721 A1 | 5/2021 | Chiang | |
| 2021/0202385 A1 | 7/2021 | Huang | |
| 2021/0225768 A1 | 7/2021 | Peng | |
| 2021/0305252 A1 | 9/2021 | Chiang et al. | |
| 2021/0305262 A1* | 9/2021 | Wang | H10B 10/125 |
| 2021/0305381 A1 | 9/2021 | Chiang et al. | |
| 2021/0351303 A1 | 11/2021 | Ju et al. | |
| 2021/0376071 A1 | 12/2021 | Liu et al. | |
| 2021/0376093 A1 | 12/2021 | Chu | |
| 2022/0115510 A1* | 4/2022 | Yu | H10D 30/6219 |
| 2022/0139911 A1 | 5/2022 | Wei | |
| 2022/0310584 A1 | 9/2022 | Wu et al. | |
| 2022/0352074 A1 | 11/2022 | Chen | |
| 2022/0367619 A1 | 11/2022 | Yu | |
| 2023/0018869 A1* | 1/2023 | Chuang | H10D 30/6755 |

* cited by examiner

200

200

CONTACT FORMATION WITH STAGGERED GATE PATTERNING

BACKGROUND

Technical Field

The present disclosure generally relates to transistors and, more particularly, to transistors with staggered gate structure and methods of creation thereof.

Description of the Related Art

Backside contacts provide a way to establish electrical connections with the backside or substrate of a transistor and enable efficient signal transmission, improved device performance, and enhanced manufacturing processes. In a typical transistor structure, the backside or substrate region is distinct from the active region where the transistor's channel and source/drain regions are located. The electrical connection established by the backside contacts provides a pathway for electrical signals, current, and voltage to flow, allowing communication between different components of an integrated circuit.

SUMMARY

According to an embodiment, a semiconductor device includes a plurality of gate caps over a plurality of gate regions, gate spacers over the sidewalls of the plurality of gate regions and the plurality of gate caps, a backside contact under a first source and drain region, and a dielectric cap over the first source and drain region. The first source and drain region is located between two adjacent gate regions of the plurality of gate regions.

In some embodiments, which can be combined with one or more previous embodiments, the dielectric cap can be made of a same material as the plurality of gate caps and the gate spacers.

In some embodiments, which can be combined with one or more previous embodiments, the semiconductor device includes a source/drain contact above each of the source/drain regions. The source/drain contact can be surrounded by an interlayer dielectric layer (ILD). In an embodiment, the dielectric cap and the ILD are made of different materials.

In an embodiment, which can be combined with one or more previous embodiments, the plurality of gate regions is so arranged in a staggered gate arrangement that there is an overlap region between each two adjacent gate regions of the plurality of gate regions. The gate spacers can pinch off the overlap region.

In several embodiments, which can be combined with one or more previous embodiments, the semiconductor device can include a second source and drain region and a contact over the second source and drain region. The contact is surrounded by the gate spacers. The first and second source and drain regions are isolated from the plurality of gate caps by the gate spacers.

In additional embodiments, which can be combined with one or more previous embodiments, the semiconductor device can include a second source/drain region and a plurality of nanosheet gates extended between the first and second source and drain regions.

In some embodiments, which can be combined with one or more previous embodiments, the semiconductor device can include a backside interlayer dielectric (BILD) located under a backend dielectric layer (BDI), and a backside power rail (BSPR) over a backside power delivery network (BSPDN). The backside contact is surrounded by the BILD, the BSPR, the BDI, and the first source and drain region.

According to an embodiment, which can be combined with one or more previous embodiments, a method for forming a semiconductor device is disclosed. The method can include forming a plurality of gate caps over a plurality of gate regions, forming gate spacers over the sidewalls of the plurality of gate regions and the plurality of gate caps, forming a backside contact under a first source and drain region, and forming a dielectric cap over the first source and drain region. The first source and drain region is located between two adjacent gate regions of the plurality of gate regions.

In an embodiment, which can be combined with one or more previous embodiments, the method further includes forming a source/drain contact above each of the source/drain regions. The source/drain contact can be surrounded by an interlayer dielectric layer (ILD). In an embodiment, the dielectric cap and the ILD are made of different materials.

In some embodiments, which can be combined with one or more previous embodiments, the method can include forming a second source/drain region and forming a plurality of nanosheet gates extended between the first and second source and drain regions.

In some embodiments, which can be combined with one or more previous embodiments, the method can include isolating the first and second source and drain regions from the plurality of gate caps by the gate spacers.

In an embodiment, which can be combined with one or more previous embodiments, the method can include forming a backside interlayer dielectric (BILD) located under a bottom dielectric isolation (BDI) and forming a backside power rail (BSPR) over a backside power delivery network (BSPDN).

According to yet another embodiment, which can be combined with one or more previous embodiments, a semiconductor device is disclosed. The semiconductor device can include a first and a second plurality of nanosheet gates, a source and drain region located between the first and the second plurality of nanosheet gates, a backside contact under the source and drain region, a dielectric cap located over the source and drain region. The backside contact is surrounded by a backside interlayer dielectric (BILD), a backside power rail (BSPR), a bottom dielectric isolation (BDI), and the source and drain region.

In an embodiment, which can be combined with one or more previous embodiments, the semiconductor further includes a gate cap over a gate region and gate spacers over sidewalls of the gate region and the gate cap.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

FIGS. 11A-111B illustrate side-views of a semiconductor device after the contact patterning, in accordance with some embodiments.

DETAILED DESCRIPTION

Overview

Figure 1C:
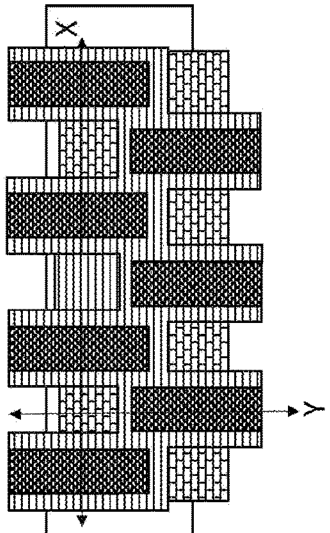
FIG. 1C depicts the side-view sections from which the semiconductor device is illustrated.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In one aspect, spatially related terminology such as “front,” “back,” “top,” “bottom,” “beneath,” “below,” “lower,” above,” “upper,” “side,” “left,” “right,” and the like, is used with reference to the orientation of the Figures being described. Since components of embodiments of the disclosure can be positioned in a number of different orientations, the directional terminology is used for purposes of illustration and is in no way limiting. Thus, it will be understood that the spatially relative terminology is intended to encompass different orientations of the device in use or operation in addition to the orientation depicted in the figures. For example, if the device in the figures is turned over, elements described as “below” or “beneath” other elements or features would then be oriented “above” the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

As used herein, the terms "lateral" and "horizontal" describe an orientation parallel to a first surface of a chip.

As used herein, the term "vertical" describes an orientation that is arranged perpendicular to the first surface of a chip, chip carrier, or semiconductor body.

As used herein, the terms "coupled" and/or "electrically coupled" are not meant to mean that the elements must be directly coupled together-intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

As used herein, certain terms are used indicating what may be considered an idealized behavior, such as, for example, "lossless," "superconductor," or "superconducting," which are intended to cover functionality that may not be exactly ideal but is within acceptable margins for a given application. For example, a certain level of loss or tolerance may be acceptable such that the resulting materials and structures may still be referred to by these "idealized" terms.

In some embodiments, a semiconductor device is disclosed. According to an embodiment, which can be combined with one or more previous embodiments, a semiconductor device includes a plurality of gate caps over a plurality of gate regions, gate spacers over the sidewalls of the plurality of gate regions and the plurality of gate caps, a backside contact under a first source and drain region, and a dielectric cap over the first source and drain region. The first source and drain region is located between two adjacent gate regions of the plurality of gate regions.

In some embodiments, which can be combined with one or more previous embodiments, the dielectric cap can be made of a same material as the plurality of gate caps and the gate spacers.

In some embodiments, which can be combined with one or more previous embodiments, the semiconductor device can include a source/drain contact above each of the source/drain regions. The source/drain contact is surrounded by an interlayer dielectric layer (ILD).

In some embodiments, which can be combined with one or more previous embodiments, the dielectric cap and the ILD are made of different materials.

In an embodiment, which can be combined with one or more previous embodiments, the plurality of gate regions is so arranged in a staggered gate arrangement that there is an overlap region between each two adjacent gate regions of the plurality of gate regions. The gate spacers can pinch off the overlap region.

In several embodiments, which can be combined with one or more previous embodiments, the semiconductor device can include a second source and drain region, and a contact over the second source and drain region. The contact is surrounded by the gate spacers. The first and second source and drain regions are isolated from the plurality of gate caps by the gate spacers.

In additional embodiments, which can be combined with one or more previous embodiments, the semiconductor device can include a plurality of nanosheet gates extended between the first and second source and drain regions.

In some embodiments, which can be combined with one or more previous embodiments, the semiconductor device can include a backside interlayer dielectric (BILD) located under a backend dielectric layer (BDI), and a backside power rail (BSPR) over a backside power delivery network (BSPDN). The backside contact is surrounded by the BILD, the BSPR, the BDI, and the first source and drain region.

According to an embodiment, which can be combined with one or more previous embodiments, a method for forming a semiconductor device is disclosed. The method can include forming a plurality of gate caps over a plurality of gate regions, forming gate spacers over the sidewalls of the plurality of gate regions and the plurality of gate caps, forming a backside contact under a first source and drain region, and forming a dielectric cap over the first source and drain region. The first source and drain region is located between two adjacent gate regions of the plurality of gate regions.

In some embodiments, which can be combined with one or more previous embodiments, the method for forming a semiconductor is so performed that the dielectric cap is made of a same material as the plurality of gate caps and the gate spacers.

In some embodiments, which can be combined with one or more previous embodiments, the method for forming a semiconductor is so performed that the plurality of gate regions is so arranged in a staggered arrangement that there is an overlap region between each two adjacent gate regions of the plurality of gate regions.

In some embodiments, which can be combined with one or more previous embodiments, the method for forming a semiconductor is so performed that the gate spacers pinch off the overlap region.

In an embodiment, which can be combined with one or more previous embodiments, the method further includes forming a second source and drain contact, and forming a plurality of nanosheet gates extended between the first and second source and drain regions.

In some embodiments, which can be combined with one or more previous embodiments, the method can include isolating the first and second source and drain regions from the plurality of gate caps by the gate spacers.

In an embodiment, which can be combined with one or more previous embodiments, the method can include forming a backside interlayer dielectric (BILD) located under a bottom dielectric isolation (BDI) and forming a backside power rail (BSPR) over a backside power delivery network (BSPDN).

In some embodiments, which can be combined with one or more previous embodiments, the method for forming a semiconductor is so performed that the backside contact is surrounded by the BILD, the BSPR, the BDI, and the first source and drain region.

According to yet another embodiment, which can be combined with one or more previous embodiments, a semiconductor device is disclosed. The semiconductor device can include a first and a second plurality of nanosheet gates, a source and drain region located between the first and the second plurality of nanosheet gates, a backside contact under the source and drain region, a dielectric cap located over the source and drain region. The backside contact is surrounded by a backside interlayer dielectric (BILD), a backside power rail (BSPR), a bottom dielectric isolation (BDI), and the source and drain region.

In an embodiment, which can be combined with one or more previous embodiments, the semiconductor further includes a gate cap over a gate region and gate spacers over sidewalls of the gate region and the gate cap.

The concepts herein relate to transistors, which are fundamental electronic devices that have revolutionized the field of electronics and staggered gates. Transistors serve as building blocks for numerous electronic circuits and are widely used in various applications.

Disclosed is a semiconductor device with staggered gate arrangements to enhance device performance and reduce power consumption. The disclosed staggered gates have such a configuration that the gate electrodes of adjacent transistors are horizontally offset from each other, creating a staggered pattern. This arrangement differs from a conventional aligned gate configuration, where the gate electrodes are aligned in a straight line. Further, the semiconductor device disclosed herein can provide enhanced electrostatic control over the channel region of transistors. The offset configuration can reduce the overlap capacitance between the gate electrode and the source/drain regions, resulting in improved control over the transistor's threshold voltage. This enables better on/off current control and reduces leakage current, leading to enhanced device performance.

Further, the disclosed semiconductor device can help mitigate short-channel effects, which become more prominent as transistor dimensions shrink. Short-channel effects, such as drain-induced barrier lowering (DIBL) and subthreshold slope degradation, can degrade transistor performance and cause variations in device characteristics. The staggered arrangement of the disclosed semiconductor device can allow for improved channel length control and reduce the impact of these effects, leading to better transistor behavior and increased device uniformity.

Even further, the semiconductor device can reduce subthreshold swing, which is a measure of how steeply the transistor switches on and off. A lower subthreshold swing value indicates better transistor performance and power efficiency. The offset configuration can reduce the fringing electric field between the gate and source/drain regions, enabling a more efficient modulation of the channel current during operation.

The staggered gate arrangements described herein can help reduce crosstalk between adjacent transistors. Crosstalk occurs when the electrical signals from one transistor interfere with neighboring transistors, leading to signal degradation and increased noise. The offset configuration reduces capacitive coupling and improves isolation between adjacent gates, reducing (e.g., minimizing) crosstalk and enhancing overall device reliability and performance. The staggered gates described herein can further contribute to improved carrier mobility within the transistor channel. By reducing the electric field gradients near the source/drain regions, the offset configuration mitigates carrier scattering effects, such as hot electron injection or impact ionization. This results in improved charge carrier transport and overall device efficiency.

Accordingly, the teachings herein provide methods and systems of semiconductor device formation with staggered gates. The techniques described herein may be implemented in a number of ways. Example implementations are provided below with reference to the following figures.

Example Semiconductor Device Structure

Figure 1B:
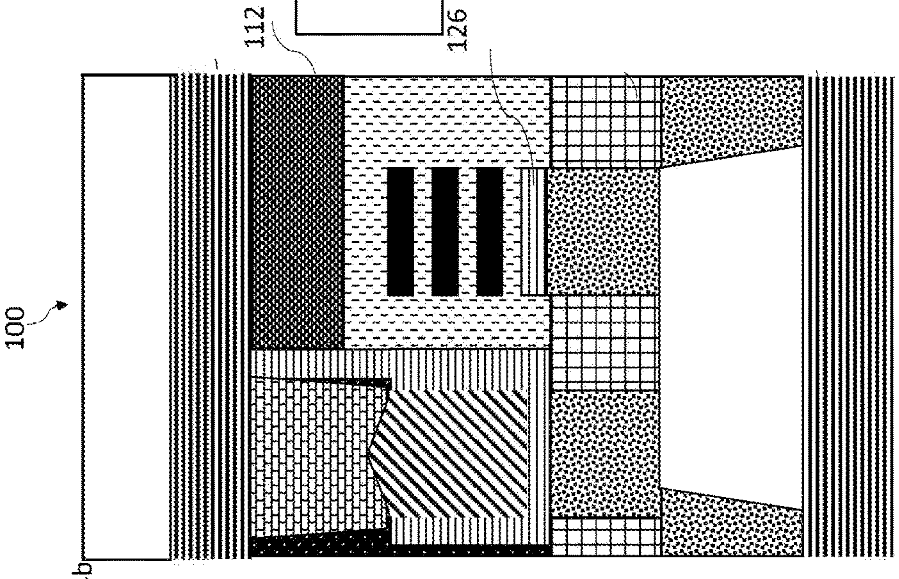
FIGS. 1A-1B illustrate a semiconductor device, in accordance with some embodiments.
Figure 1A:
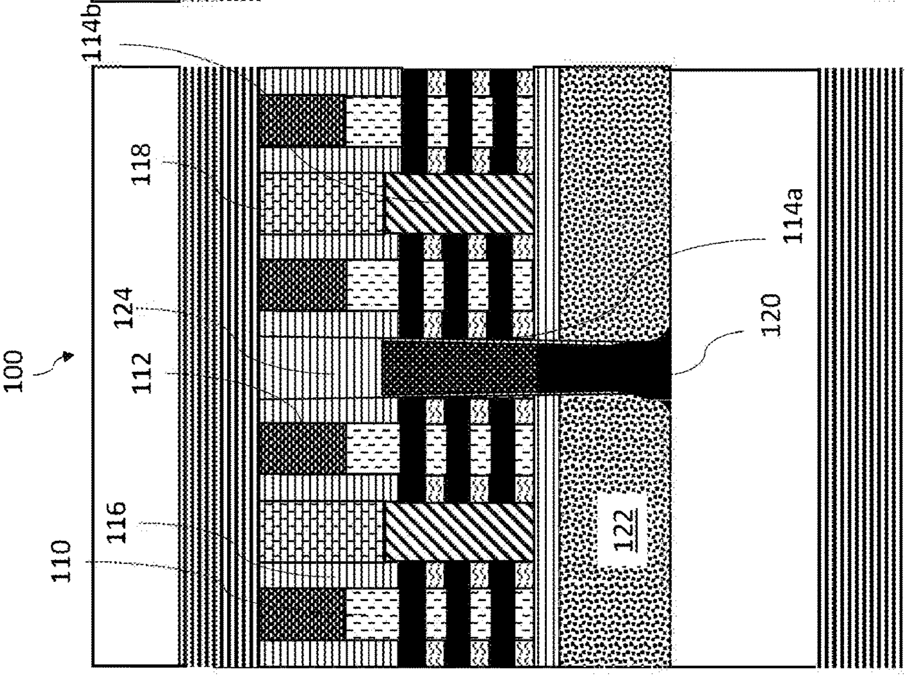

Reference now is made to FIGS. 1A-1B, which are simplified cross-section views of a semiconductor device 100, consistent with an illustrative embodiment. FIG. 1C depicts each section from which the semiconductor is shown. For example, FIG. 1A, and other figures denoted by A, illustrate an X section of the semiconductor and FIG. 1B, and other figures denoted by B, illustrate a Y1 section of the semiconductor device.

The semiconductor device 100 can include a plurality of gate regions 110, a plurality of gate caps 112, a first and second source/drain regions 114*a* and 114*b*, gate spacers 116, a self-aligned contact (SAC) 118, a backside contact area (BSCA) 120, a backside interlayer dielectric (BILD) 122, and a dielectric cap 124.

In various embodiments, the plurality of gates serves as control elements that regulate the flow of current through the semiconductor device 100. The plurality of gates 110 can be composed of a conductive material. The plurality of gates 110 can control the flow of electric current between the source and drain regions. In some embodiments, by applying a voltage to the gate, the channel region's conductivity is modulated, allowing the semiconductor device 100 to either allow or block the flow of current, which in turn enables the semiconductor device 100 to act as electronic switches or amplifiers. The gate voltage can determine whether the semiconductor device 100 is in an "on" or "off" state. When the gate voltage is below a certain threshold, the semiconductor device 100 is in the "off" state, and the current flow between the source and drain is effectively blocked. On the other hand, when the gate voltage exceeds the threshold, the semiconductor device 100 enters the "on" state, allowing current to flow through the channel region. In addition to acting as a switch, modulating the gate voltage can enable the plurality of gates 110 to control the current flowing through the channel region, resulting in amplified output signals.

In an embodiment, the plurality of gates 110 can enable the implementation of Boolean logic operations, such as AND, OR, and NOT, by controlling the flow of current based on the input voltages. Multiple semiconductor devices 100 can be interconnected to form complex logic circuits, enabling the execution of various computational tasks in digital systems. In some embodiments, the plurality of gates 110, along with other semiconductor device components, can facilitate the miniaturization and integration of electronic circuits. The ability to control the channel region's conductivity through the gate voltage allows for compact and highly efficient circuit designs.

The plurality of gates 110 can be arranged in a staggered configuration, such that adjacent gate electrodes, e.g., two adjacent gates of the plurality of gates, are horizontally offset from each other, creating a staggered pattern. Such a staggered configuration can provide enhanced electrostatic control over the channel region of the semiconductor device 100, which can reduce the overlap capacitance between the plurality of gates 110 and the first and second source/drain regions 114*a* and 114*b*, resulting in improved control over the semiconductor device's threshold voltage. Further, the staggered configuration can help mitigate short-channel effects, and allow for improved channel length control, leading to improved behavior and increased device uniformity.

The plurality of gate caps 112 can be formed by the gate electrode and the insulating gate oxide layer that separates the gate electrode, i.e., the plurality of gates 110, from the channel region of the semiconductor device 100. In various embodiments, the plurality of gate caps 112 can act as capacitors to store and release electrical charge. In such embodiments, each gate region, which can be made of a conductive material such as doped polysilicon or metal, can form one plate of the capacitor. The insulating gate oxide layer, which can be made of materials such as silicon dioxide ($SiO2$), can serve as a dielectric, and separate the gate region from the channel region, which acts as the second plate of the capacitors, i.e., the gate caps. Such a capacitive element, i.e., the gate cap, can allow the gate cap to store and control electric charge.

In an embodiment, the capacitance of the plurality of gate caps 112 can determine the amount of charge that can be stored when a voltage is applied to the gate electrode. By modulating the voltage on the gate region, the charge stored in the plurality of gate caps 112 can be controlled. This voltage control can facilitate regulating the operation of the semiconductor device 100, including turning the semiconductor device 100 on or off, modulating the current flow through the channel of the semiconductor device 100, and controlling the semiconductor device's overall behavior. In several embodiments, the plurality of gate caps 112 can be used to determine the threshold voltage of the semiconductor device 100. Typically, the threshold voltage is the minimum voltage required on the gate region to initiate significant current flow through the channel. The plurality of gate caps' capacitance, along with the properties of the gate oxide layer, can affect the threshold voltage, which can influence the semiconductor device's switching characteristics and determine its operation as an enhancement mode or depletion mode device. In additional embodiments, the plurality of gate caps 112 can further contribute to signal amplification in the semiconductor device 100. In such embodiments, when an input signal is applied to the gate region, the charge stored in the plurality of gate caps 112 can be modulated, resulting in the amplification of the signal at the output.

Generally, the source/drain regions 114*a* and 114*b* are two salient components that play relevant roles in the semiconductor device's operation. In various embodiments, the source/drain regions are regions within the semiconductor material, e.g., the semiconductor device 100, where the current flows in and out of the semiconductor device 100. The source region is the region through which the majority of charge carriers (e.g., electrons or holes) enter the channel of the semiconductor device and is responsible for providing the current that flows through the semiconductor device. The source region is typically doped to have an excess of charge carriers, creating a region with high carrier concentration. This abundance of carriers allows for the efficient injection of electrons or holes into the channel when a voltage is applied.

The drain region, on the other hand, is the region where the majority of charge carriers exit the channel. The drain region receives the current from the channel and carries the charge away from the transistor. Similar to the source, the drain region is also doped to have a high carrier concentration. The doping profile in the drain region ensures that carriers can easily flow out of the channel and into the drain region.

The gate spacers 116 can be thin insulating layers or materials placed on the sidewalls of the plurality of gates 110 and the gate caps 112. The gate spacers 116 can help control the effective channel length of the semiconductor device 100. In various embodiments, the plurality of gates 110, and the plurality of gate caps 112, along with the gate spacers 116, can define the region where current flows between the first and second source/drain regions 114*a* and 114*b*. In an embodiment, the gate spacers 116 can allow for control over the channel's conductive properties, including resistance and carrier mobility, which can contribute to improved performance of the semiconductor device 100.

In some embodiments, the gate spacers 116 can act as insulating layers between the plurality of gates 110 and the first and second source/drain regions 114*a* and 114*b*. That is, the gate spacers 116 can help prevent current leakage or short circuits between the plurality of gates 110 and the first and second source/drain regions 114*a* and 114*b*. Such isolation can help maintain the integrity of the semiconductor device's electrical operation and prevent unintended current flow that could negatively impact the performance of the semiconductor device 100 and reliability.

In further embodiments, the gate spacers 116 can be utilized to modulate the overlapping capacitance between the plurality of gates 110 and the first and second source/drain regions 114*a* and 114*b*. Overlapping capacitance can affect the semiconductor device's electrical characteristics, such as threshold voltage and switching behavior. Thus, by adjusting the thickness and material properties of the gate spacers 116, the overlapping capacitance can be optimized, which can allow for better control and modulation of the semiconductor device's behavior.

In several embodiments, the gate spacers 116 can help mitigate the short-channel effects by physically separating the plurality of gates 110 from the first and second source/drain regions 114*a* and 114*b*. To that end, the gate spacers 116 can create a barrier that restricts the extension of the electric field into the channel region, reducing the impact of drain-induced barrier lowering and subthreshold leakage. This mitigation can improve the semiconductor device's performance, reduce power consumption, and enhance overall device reliability.

In an embodiment, the gate spacers 116 can further serve as barriers that prevent the lateral diffusion of dopant atoms from the first and second source/drain regions 114*a* and 114*b*, into the channel region during the doping process. Such diffusion can alter the channel characteristics and compromise the semiconductor device's performance. By confining the dopant diffusion, the gate spacers 116 can contribute to maintaining the desired semiconductor device's characteristics and electrical behavior.

The self-aligned contact, SAC, 118, can establish electrical connections between the first and second source/drain regions 114*a* and 114*b*, and the metal interconnect layers. Unlike conventional contacts, which are aligned based on predefined lithographic patterns, the SAC 118 can be formed in a self-aligned manner. This alignment precision allows for tighter contact spacing and ensures accurate alignment with the active regions, minimizing parasitic resistances and improving device performance. In some embodiments, the SAC 118 can enable the formation of contact structures with reduced resistance. By aligning the contacts directly to the first and second source/drain regions 114*a* and 114*b*, the contact resistance is minimized, resulting in improved current flow and reduced power consumption. The SAC 118 can help reduce the parasitic capacitance between the first and second source/drain regions 114*a* and 114*b* and the metal interconnect layers. By aligning the contact directly to the active regions, the contact area is minimized, thereby reducing the overlap capacitance. Lower parasitic capacitance improves circuit performance, enabling higher switching speeds and reduced signal delays. In additional embodiments, the SAC 118 can simplify the fabrication process by eliminating the need for additional lithography and alignment steps. The self-alignment approach can use the existing patterned features of the semiconductor device 100, saving time, cost, and complexity in the manufacturing process.

The BSCA 120 is a region on the backside of the semiconductor device 100 where electrical connections are made. By establishing the electrical contacts, the BSCA 120 ensures the proper functioning of the semiconductor device 100 and facilitates electrical signal transmission.

The BSCA 120 can serve as a thermal interface between the semiconductor device 100 and a heat sink or other cooling mechanisms. By establishing direct contact with the substrate, the BSCA 120 can conduct the heat away from the semiconductor device 100, and contribute to improved thermal dissipation. In some embodiments, the BSCA 120 can help mitigate parasitic effects, such as substrate coupling or substrate noise, from the semiconductor device 100. In further embodiments, the BSCA 120 can allow for increased integration density in the semiconductor device 100. In an embodiment, the BSCA 120 can serve as a means of providing electrostatic discharge (ESD) protection to the semiconductor device 100. ESD events can cause significant damage to sensitive electronic components and thus should be avoided.

The BILD 122 can be an insulating material or layer used to isolate and provide electrical insulation between the semiconductor device's active regions and the BSCA 120, and to prevent unwanted electrical contact between the active regions and the backside contact, ensuring the proper functioning and integrity of the semiconductor device 100. In various embodiments, the BILD 122 can act as a protective layer, shielding the active regions of the semiconductor device 100 from external contaminants, moisture, and mechanical stress. The BILD 122 can further help prevent physical damage, such as scratches or particle contamination, which could adversely affect semiconductor device performance. Additionally, the BILD 122 can act as a barrier against moisture ingress, which can cause corrosion and degradation of the semiconductor device's components.

In several embodiments, the BILD 122 can provide structural support to the semiconductor device 100 by maintaining the mechanical integrity and stability of the semiconductor device 100. The BILD 122 can further help prevent the warping, bending, or cracking of the substrate, particularly during the manufacturing process or subsequent handling. The BILD 122 can ensure that the semiconductor device 100 remains mechanically robust and maintains its dimensional stability.

In an embodiment, the BILD 122 can also serve as a planarization layer in the semiconductor device 100 fabrication process. As various layers are deposited and patterned on the front side of the semiconductor device 100, irregularities or topographic variations may arise. The BILD 122 can be used to smoothen the surface, creating a more planar substrate for subsequent processing steps, such as metal interconnect deposition or bonding.

In some embodiments, a low dielectric constant BILD material can be utilized to reduce signal delays, crosstalk, and power consumption in high-speed and high-frequency circuits. By optimizing the dielectric constant, the BILD 122 can contribute to improved overall semiconductor device performance.

In several embodiments, BILD 122 can facilitate wafer-level testing of the semiconductor device 100. By providing electrical isolation between the active regions and the backside contact, individual semiconductor device or elements on the semiconductor device can be electrically accessed and tested without interference from neighboring devices or components. This enables efficient and accurate wafer-level testing, ensuring quality control during semiconductor manufacturing.

The dielectric cap 124 can be a thin insulating layer or material placed on top of the plurality of gates 110, serving as a protective and performance-enhancing component, to prevent unintended electrical contact or leakage between the plurality of gates 110 and nearby components, e.g., the first and second source/drain regions 114*a* and 114*b*, ensuring proper operation and avoiding electrical short circuits.

The dielectric cap 124 can act as a charge barrier to prevent the loss or diffusion of electric charge from the plurality of gates 110. In an embodiment, the dielectric cap 124 can serve as a protective layer for the underlying gate oxide, which is a thin insulating layer between the plurality of gates 110 and the channel region. By covering the gate oxide with the dielectric cap 124, the gate oxide is shielded from physical damage, contamination, or chemical reactions that could degrade its electrical properties. In some embodiments, the dielectric cap 124 can be used to control and manage the mechanical stress in the semiconductor device structure. In several embodiments, the dielectric cap 124 serves as a surface passivation layer, protecting the semiconductor device's surface from contamination, oxidation, or other environmental effect.

Example Processes for Semiconductor Device with Staggered Gate Structures

With the foregoing description of an example semiconductor device 200, it may be helpful to discuss an example process of manufacturing the same. To that end, FIGS. 2-20 illustrate various steps in the manufacture of a semiconductor device 200, consistent with illustrative embodiments. As noted above, figures denoted by A and B illustrate a step of fabrication of the semiconductor device 100 from a different point of view. It is also worth mentioning that the semiconductor 100 depicted in FIGS. 1A-1B can be the same as the semiconductor 200 depicted in FIGS. 2-20.

Figure 2C:
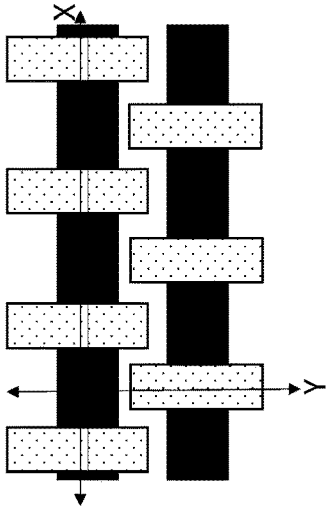
FIG. 2C depicts the side-view sections from which the semiconductor device is illustrated.
Figure 2B:
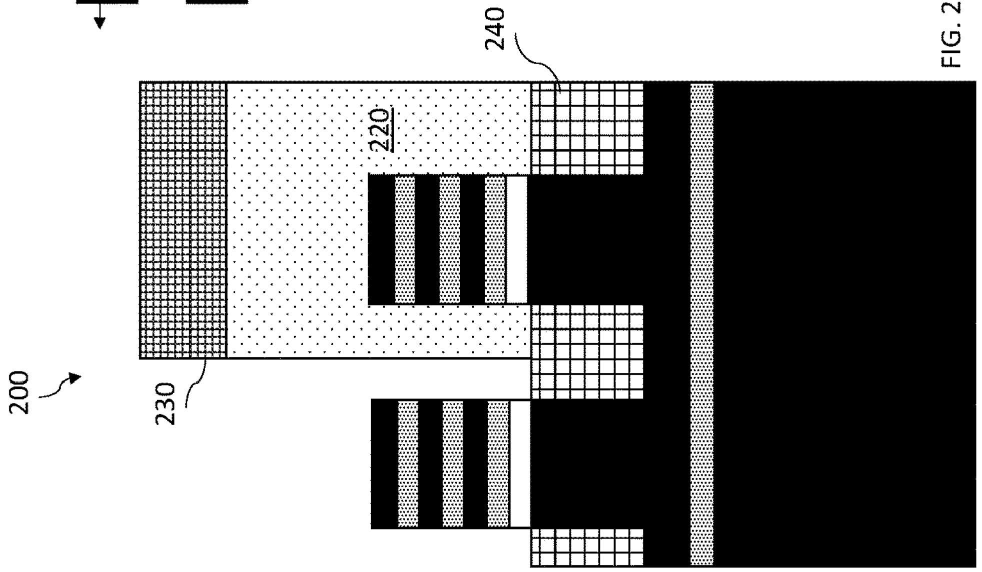
FIGS. 2A-2B illustrate side-views of a semiconductor device after the patterning of the plurality of gates, in accordance with some embodiments.
Figure 2A:
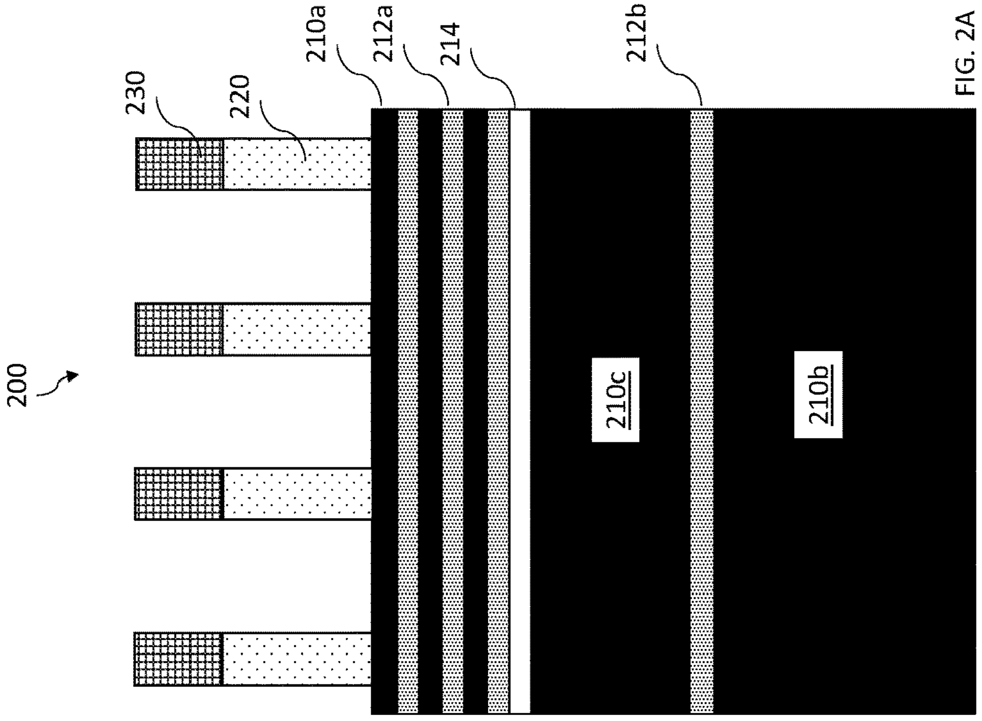

Referring to FIGS. 2A-2B now, a semiconductor device 200 after the pattering of the plurality of gates. The active layer can include alternating layers of Si and SiGe 210*a* and 212*a* to be used to form the plurality of nanosheets, formed over a first substrate 210*b*. In the illustrative example depicted in FIGS. 2A-2B, the semiconductor device 200 is depicted as being on silicon as the first substrate 210*b*, while it will be understood that other types as substrates may be used as well, including, without limitation, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs), and quaternary (four elements, e.g., aluminum gallium indium phosphide (AlInGaP)) alloys.

In various embodiments, the first substrate **210*b*** may include any suitable material or combination of materials, such as doped or undoped silicon, glass, dielectrics, etc. For example, the substrate may include a silicon-on-insulator (SOI) structure, e.g., with a buried insulator layer, or a bulk material substrate, e.g., with appropriately doped regions, typically referred to as wells. In another embodiment, the substrate may be silicon with silicon oxide, nitride, or any other insulating film on top.

In various embodiments, an etch stop layer **212*b* is formed over the first substrate 210*b*. The etch stop layer 212*b* can be a thin layer of material incorporated into the structure of the semiconductor device 200 to provide a selective barrier against etching processes, preventing further removal of underlying materials during fabrication. The etch stop layer 212*b* can enable precise control over the etching depth and help define the desired device dimensions. The etch stop layer 212*b* can further provide a stopping point for the etching process, ensuring that specific layers or regions are not etched beyond a certain point, leading to accurate patterning and control of critical features. The etch stop layer 212*b* can create a distinct separation between different layers or components within the device structure, and prevent the undesired etching of underlying layers or materials, enabling the creation of complex, multi-layered structures with well-defined interfaces and boundaries. In some embodiments, the etch stop layer 212*b*** acts as a protective barrier for sensitive or delicate materials to shield such materials from aggressive etchants, preventing damage or degradation during subsequent fabrication steps.

In some embodiments, prior to forming the etch stop layer **212*b*, the first substrate 210*b* is prepared by cleaning and removing any impurities or oxide layers. The etch stop layer 212 is deposited onto the first substrate 210*b* using techniques such as chemical vapor deposition (CVD), physical vapor deposition (PVD), or atomic layer deposition (ALD). In an embodiment, a photoresist can be applied, exposed to a patterned mask, developed, and used as a protective layer to define the etch stop regions. The etch stop layer 212*b*** can then be selectively etched, stopping at a predetermined depth, while protecting the underlying layers. After the etching process, the remaining photoresist can be removed through stripping techniques.

While in some embodiments, SiGe is used to form the etch stop layer **212*b*, in some embodiments, silicon nitride (SiN) or silicon oxynitride (SiON) can be used as the etch stop layer 212*b*. In some embodiments, a second substrate layer 210*c* is epitaxially grown over the etch stop layer 212*b***.

The alternating layers of Si and SiGe **210*a* and 212*a* can be heavily doped with donor impurities such as phosphorus or arsenic to provide an excess of electrons in an n-type semiconductor device 200. Similarly, in some embodiments, the alternating layers of Si and SiGe 210*a* and 212*a*** can be heavily doped with acceptor impurities such as boron or gallium.

A SiGe layer 214 can be formed over the second substrate **210*c*. The SiGe layer 214 can have a higher concentration of Ge compared to the SiGe layers 212*a*. In an embodiment, the Ge content of the SiGe layer 214 is about 55% Ge. The alternating layers of Si and SiGe 210*a* and 212*a*** can be deposited using techniques such as thermal oxidation, CVD, PVD.

In some embodiments, a dummy gate 220 is formed above the alternating layers of Si and SiGe, followed by forming a hard mask 230 over the dummy gate 220. The hard mask 230 can be a thin layer of material to act as a protective layer and to enable precise pattern transfer to the underlying layers during various fabrication steps and aid in pattern transfer. The hard mask 230 can act as a template for defining the desired patterns on the underlying layers, and provide a protective layer that withstands subsequent etching or deposition processes, ensuring precise pattern transfer with high fidelity. In various embodiments, the hard mask 230 resists etchants that are aggressive towards the underlying layers, preventing their undesired removal or damage. In additional embodiments, the hard mask 230 serves as a barrier between different fabrication steps, allowing compatibility with subsequent processes. In order to form the hard mask 230, the hard mask material is deposited onto the semiconductor device 200 using techniques such as CVD, PVD, or ALD. Silicon nitride (SiN) and silicon oxide (SiO2) can be used as hard masks.

In several embodiments, shallow trench isolation, STI, 240 is formed below the alternating layers of Si and SiGe **210*a* and 212*b*, which includes shallow trenches in the semiconductor device 200 filled with insulating materials to form isolation structures. The STI 240 can provide electrical isolation between adjacent transistors or components within the semiconductor device 200. The STI 240 can prevent electrical interference, leakage, and crosstalk, ensuring that the semiconductor device 200 operates independently and reliably. In an embodiment, STI 240 can help reduce parasitic capacitance between adjacent transistors. The STI 240 also can prevent latch-up, a condition where a parasitic thyristor-like structure causes unintended device behavior. The STI 240** can further interrupt the formation of the parasitic p-n-p-n structure, enhancing device reliability.

Figure 3C:
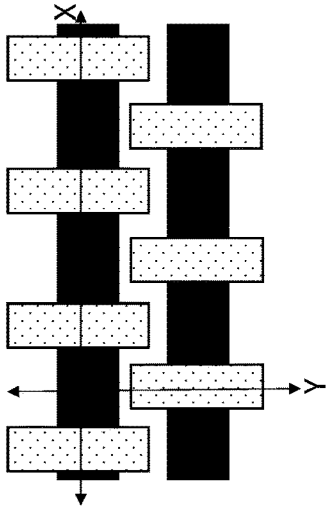
FIG. 3C depicts the side-view sections from which the semiconductor device is illustrated.
Figure 3B:
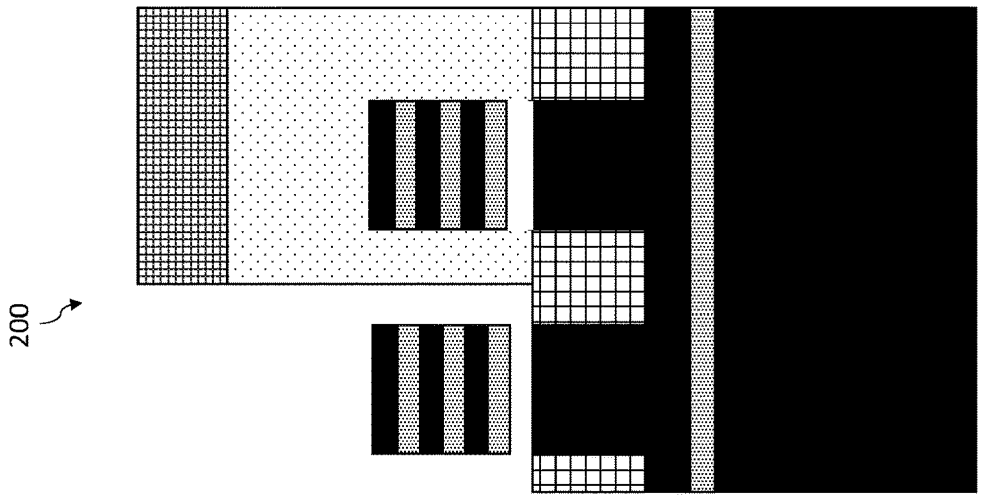
FIGS. 3A-3B illustrate side-views of a semiconductor device after the removal of a SiGe layer, in accordance with some embodiments.
Figure 3A:
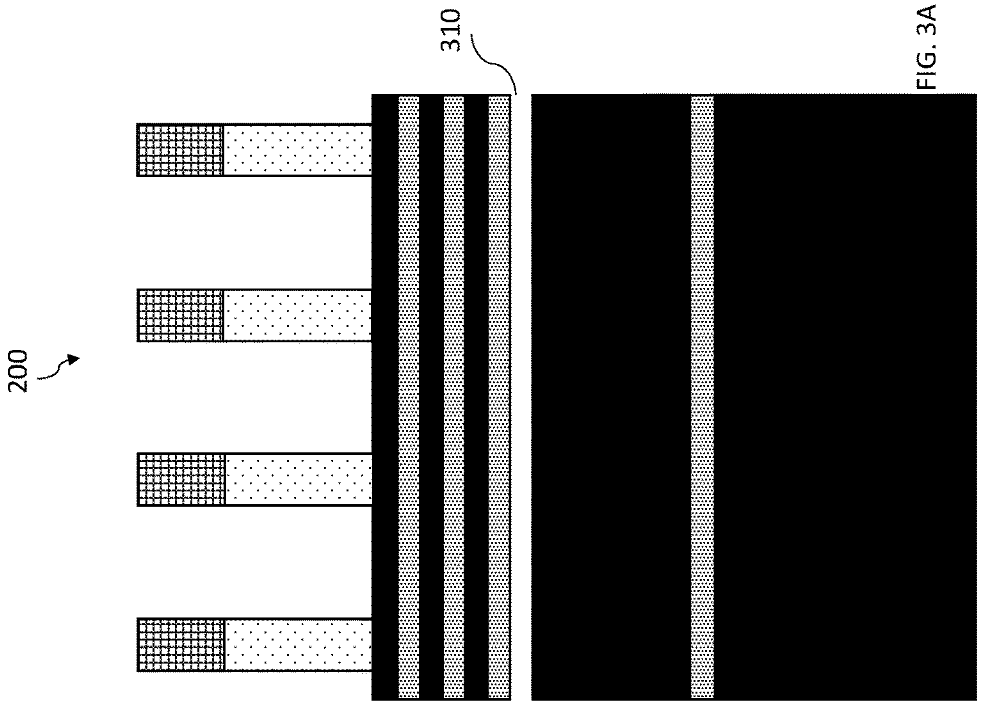

FIGS. 3A-3B illustrate side-views of a semiconductor device 200 after the removal of the SiGe layer, in accordance with some embodiments. The SiGe layer, which has a higher content of Ge compared to SiGe layers of the alternating layers of Si and SiGe, is removed. Thus, a horizontal cavity layer 310 is formed between the second substrate and the alternating layers of Si and SiGe. In some embodiments, the high-Ge SiGe is removed by an etching process.

Figure 4C:
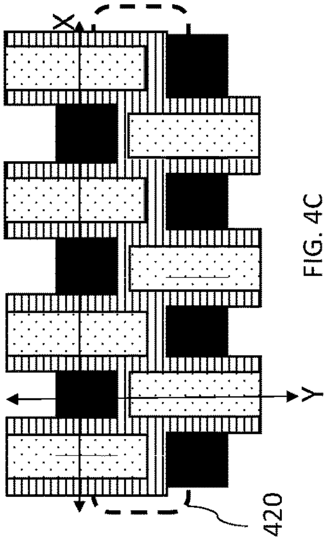
FIG. 4C depicts the side-view sections from which the semiconductor device is illustrated.
Figure 4B:
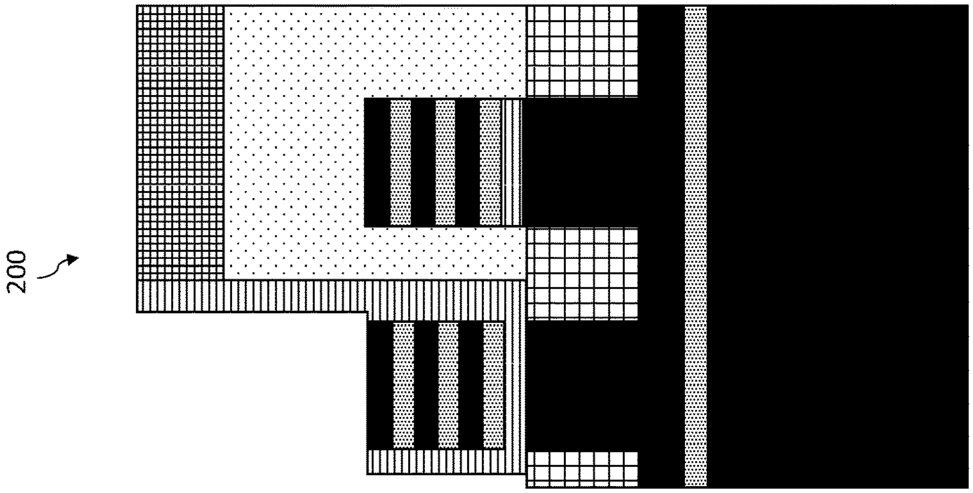
FIGS. 4A-4B illustrate side-views of a semiconductor device after the formation of the gate spacers, in accordance with some embodiments.
Figure 4A:
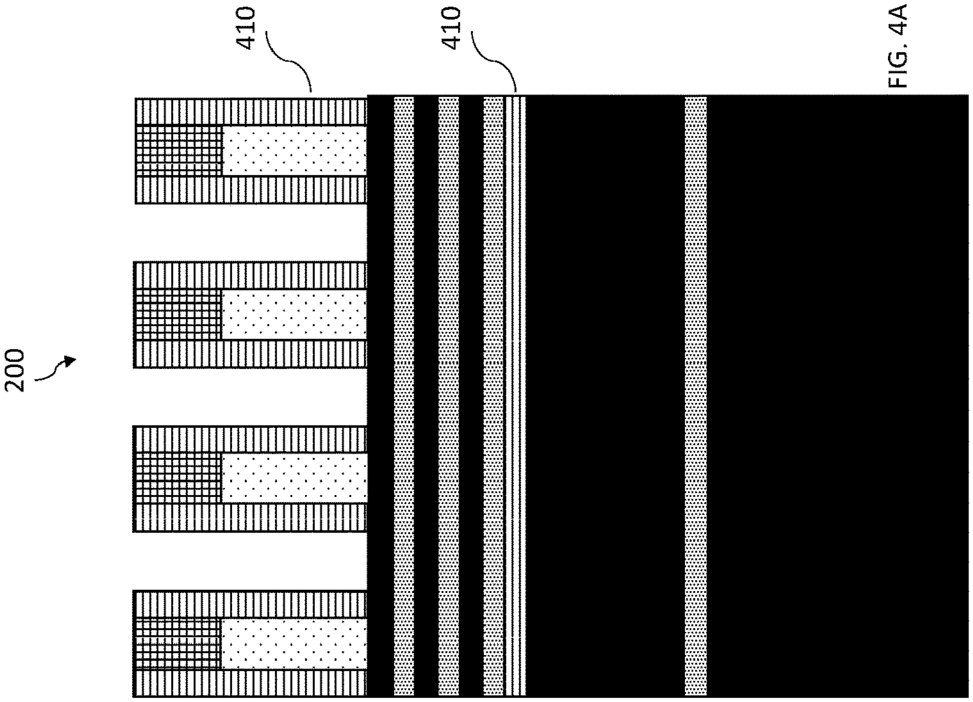

FIGS. 4A-4B illustrate side-views of a semiconductor device 200 after the formation of the gate spacers. In some embodiments, the gate spacers 410 can be formed over sidewalls of the dummy gate-hard mask, and within the cavity formed after removal of the high-Ge SiGe layer. The gate spacers 410 can be formed by deposition techniques. Alternatively, the gate spacers 410 can be formed by etching or selectively epitaxially growing the gate spacers 410 over the sidewalls of the dummy gate-hard mask and within the cavity. In various embodiments, the gate spacers 410 can include SiGe.

Figure 5C:
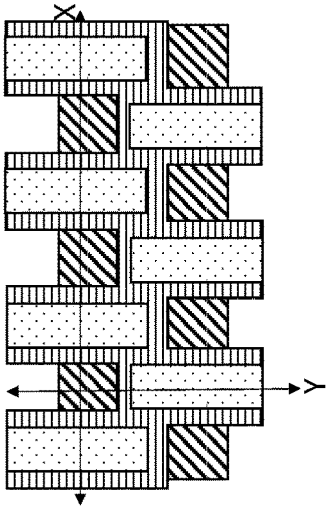
FIG. 5C depicts the side-view sections from which the semiconductor device is illustrated.
Figure 5B:
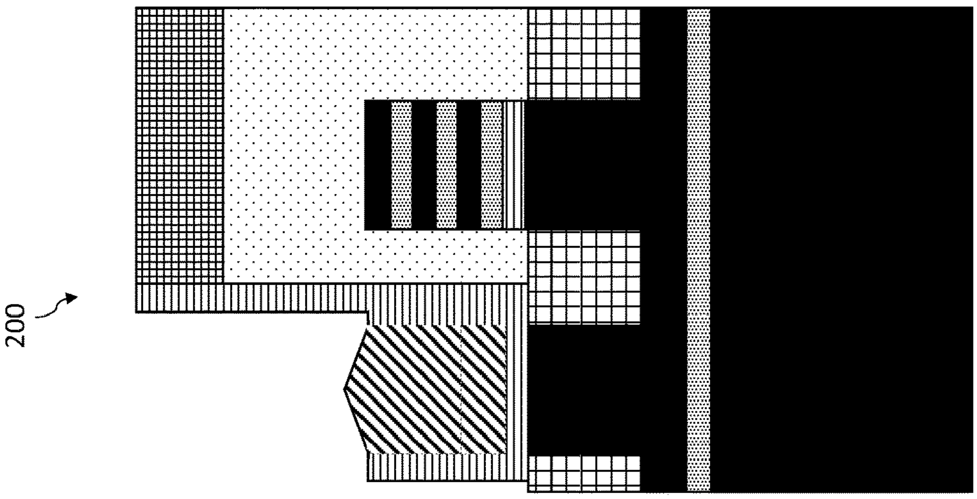
FIGS. 5A-5B illustrate side-views of a semiconductor device after the nanosheets are recessed, and the inner spacer is formed, in accordance with some embodiments.
Figure 5A:
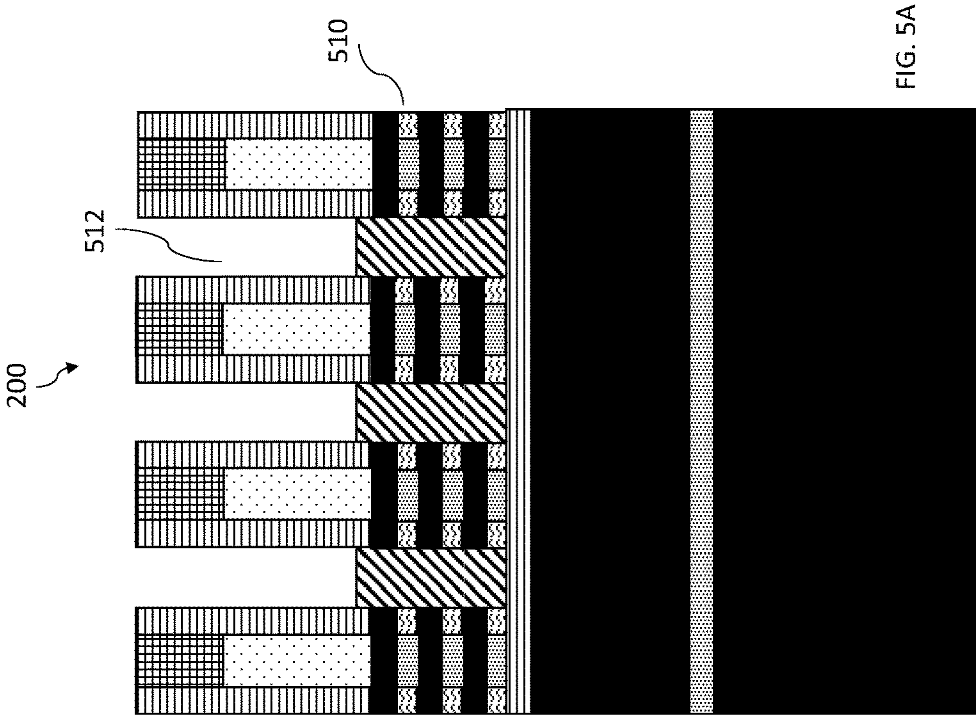

FIGS. 5A-5C illustrate side-views of a semiconductor device after nanosheets are recessed, and the inner spacer is formed. In an embodiment, the space between the dummy gate-hard mask layers is recessed to form a plurality of nanosheets which includes the alternating layers of Si and SiGe. The sidewalls of the SiGe layers of the alternating layers of Si and SiGe are further indented and covered by an inner spacer 510. In various embodiments, the first and second source/drain regions 512 are formed in the spaces between the dummy gate-hard mask layers and over the gate spacer. In an embodiment, the first and second source/drain regions 512 are epitaxially grown.

Figure 6C:
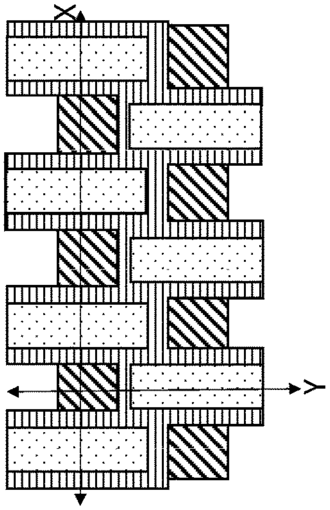
FIG. 6C depicts the side-view sections from which the semiconductor device is illustrated.
Figure 6B:
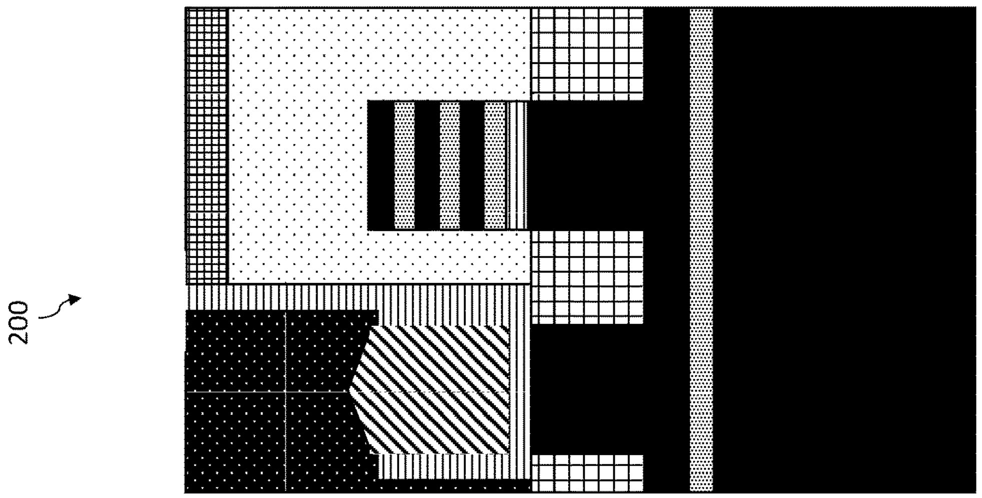
FIGS. 6A-6B illustrate side-views of a semiconductor device after the formation of the interlayer dielectric, in accordance with some embodiments.
Figure 6A:
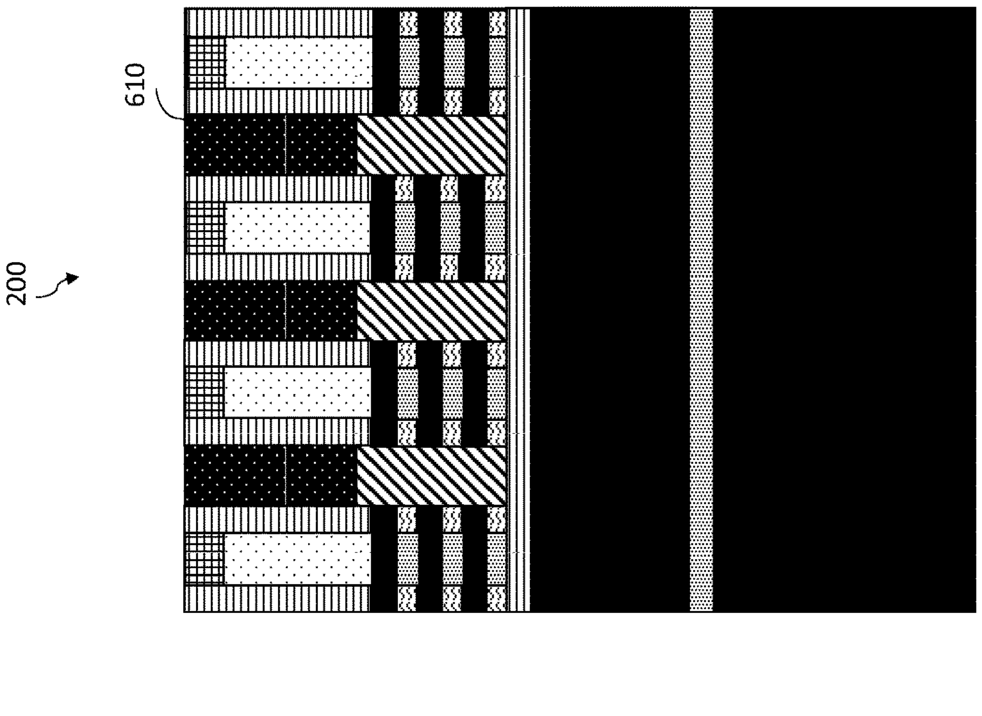

FIGS. 6A-6B illustrate side-views of a semiconductor device after the formation of the ILD. The interlayer dielectric, ILD, 610 can be a layer of insulating material to electrically isolate and provide mechanical support between different layers of conducting and active components. The ILD 610 can enable efficient signal transmission, reduce crosstalk, and ensure the proper functioning of the semiconductor device 200. In an embodiment, the ILD 610 can electrically isolate adjacent conducting layers or active components in the semiconductor device 200. By providing insulation between different layers, the ILD 610 can prevent electrical shorts, minimize leakage current, and ensure that signals are directed only along the desired pathways. In some embodiments, the ILD 610 can help reduce parasitic capacitance between adjacent metal interconnects or active devices and provide mechanical support to the semiconductor device's structure.

The ILD 610 can be deposited onto the substrate using various techniques such as CVD, spin-on deposition, plasma-enhanced CVD (PECVD), or ALD. In some embodiments, after deposition, planarization techniques are employed to ensure a flat and smooth surface. In an embodiment, chemical mechanical polishing (CMP) can be used to remove excess material and achieve a uniform surface topography. In some embodiments, silicon dioxide (SiO2), or a low-k dielectric, e.g., organosilicates, fluorinated silicates, or porous materials, can be used as ILD 610. Alternatively, polymer-based materials, such as polyimide or polybenzoxazole (PBO), can be used as ILD 610. In some embodiments, the dielectric cap and the ILD 610 are made of different materials.

Figure 7C:
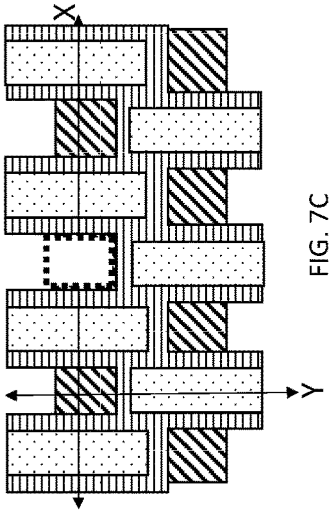
FIG. 7C depicts the side-view sections from which the semiconductor device is illustrated.
Figure 7B:
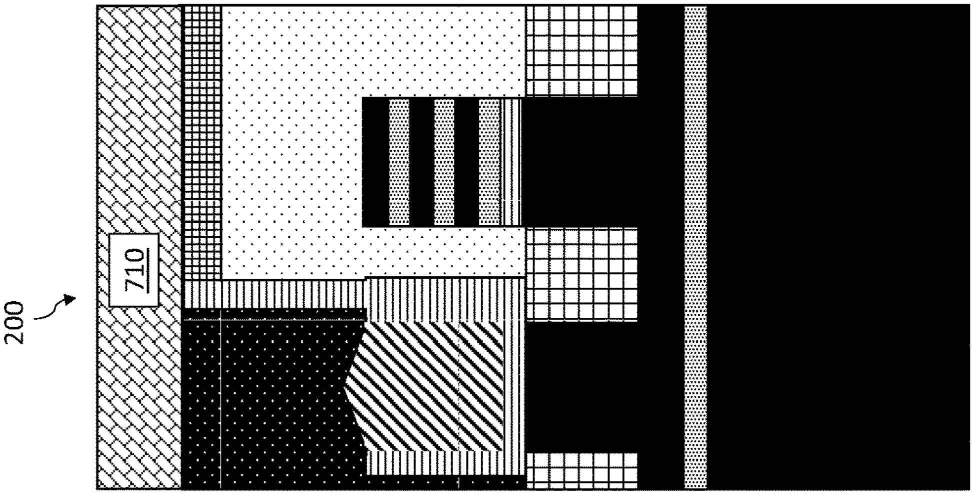
FIGS. 7A-7B illustrate side-views of a semiconductor device after the patterning of the backside contacts, in accordance with some embodiments.
Figure 7A:
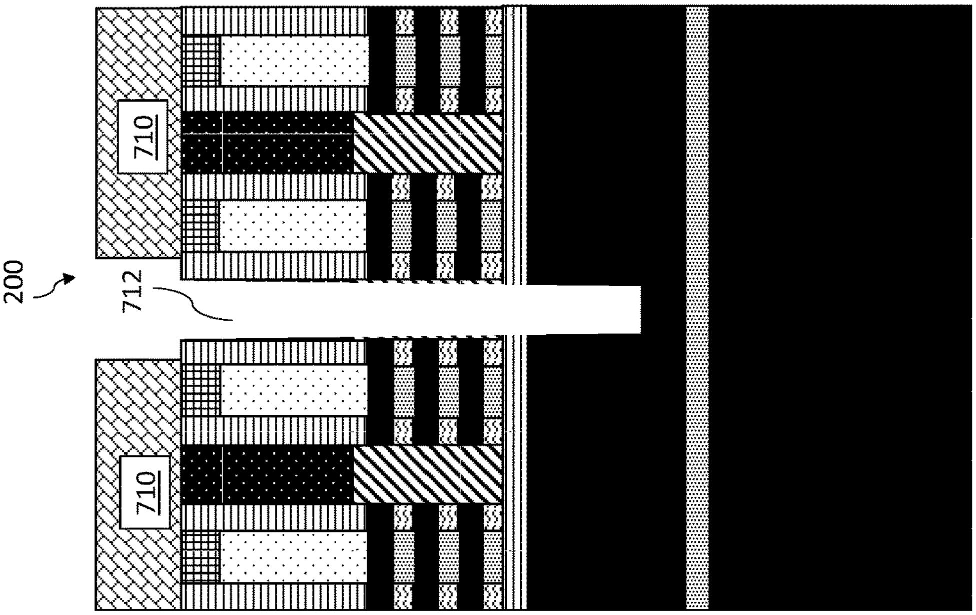

FIGS. 7A-7B illustrate side-views of a semiconductor device after the patterning of the backside contact, in accordance with some embodiments. In some embodiments, an organic planarization layer, OPL, 710 is formed under the BILD. The OPL 710 can include a photo-sensitive organic polymer having a light-sensitive material that, when exposed to electromagnetic radiation, is chemically altered and thus configured to be removed using a developing solvent. For example, in some embodiments, the photosensitive organic polymer can be polyacrylate resin, epoxy resin, phenol resin, polyamide resin, polyimide resin, unsaturated polyester resin, polyphenylene ether resin, polyphenylene sulfide resin, or benzo-cyclobutene (BCB). In some embodiments, the OPL 710 can include any organic polymer and a photoactive compound having a molecular structure that can attach to the molecular structure of the organic polymer. In some embodiments, the OPL 710 material is selected to be compatible with an overlying antireflective coating (not shown) and/or an overlying photoresist (not shown). In some embodiments, the OPL 710 can be applied using spin coating technology, although other techniques are within the contemplated scope of the present disclosure. Once the OPL 710 is formed, the backside contact patterning is performed to form a recess 712. In some embodiments, a dummy gate-hard mask layer above the first source/drain region, and the first source/drain region are removed, as part of the formation of the recess 712. In additional embodiments, the recess 712 is further extended by removing the gate spacer and portions of the second substrate. In various embodiments, the recess 712 extends within the second substrate but does not reach the etch stop layer.

Figure 8C:
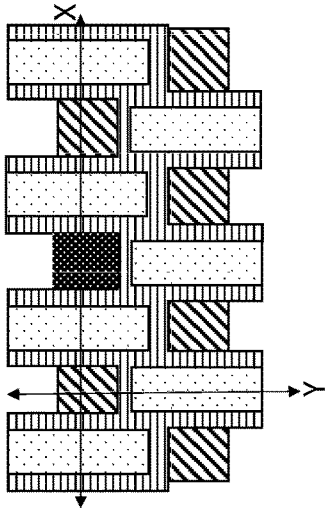
FIG. 8C depicts the side-view sections from which the semiconductor device is illustrated.
Figure 8B:
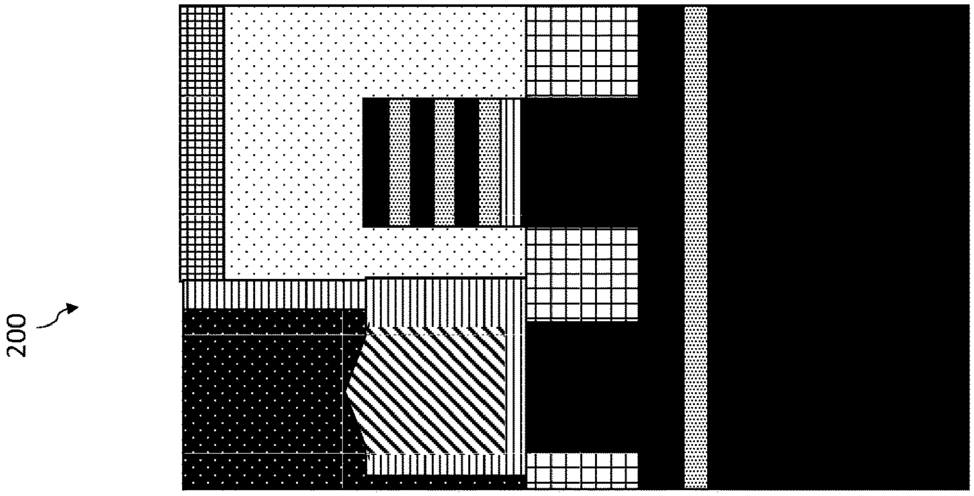
FIGS. 8A-8B illustrate side-views of a semiconductor device after formation of the placeholder, in accordance with some embodiments.
Figure 8A:
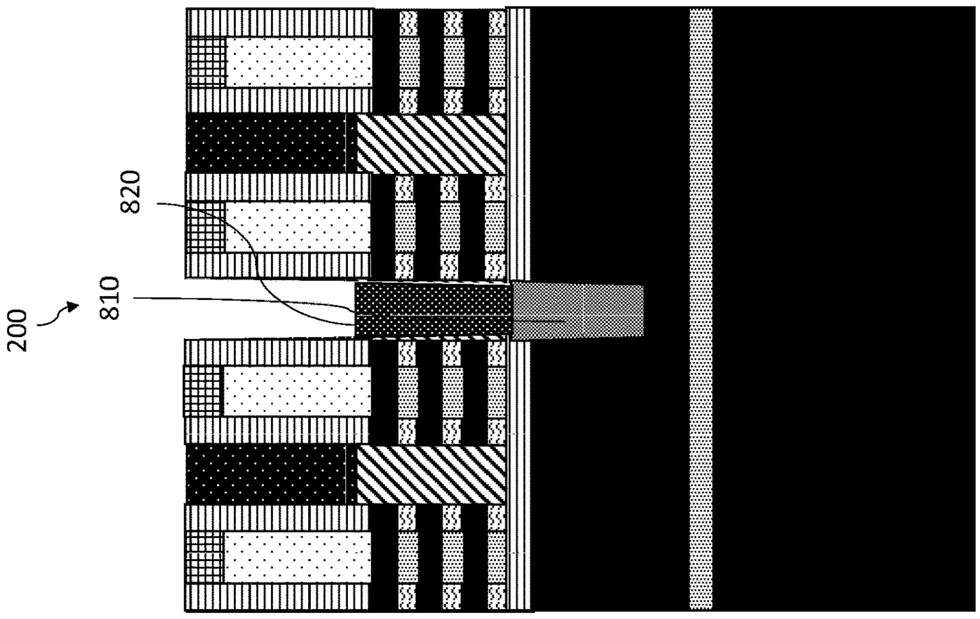

FIGS. 8A-8B illustrate side-views of a semiconductor device after the placeholder is grown, in accordance with some embodiments. In an embodiment, a portion of the recess within the second substrate and the spacer layer can be filled with a placeholder 810. The placeholder 810 can be epitaxially grown. Subsequently, a new source/drain region 820 is epitaxially grown over the placeholder 810.

Figure 9C:
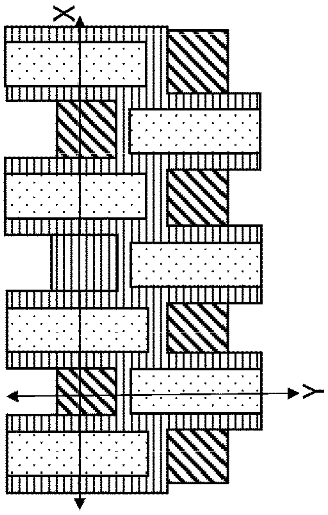
FIG. 9C depicts the side-view sections from which the semiconductor device is illustrated.
Figure 9B:
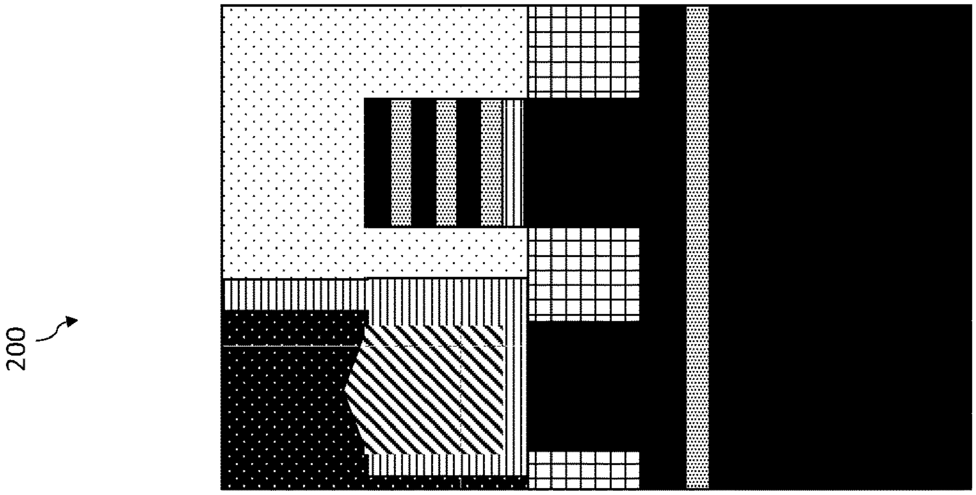
FIGS. 9A-9B illustrate side-views of a semiconductor device after filling the space with the spacer, in accordance with some embodiments.
Figure 9A:
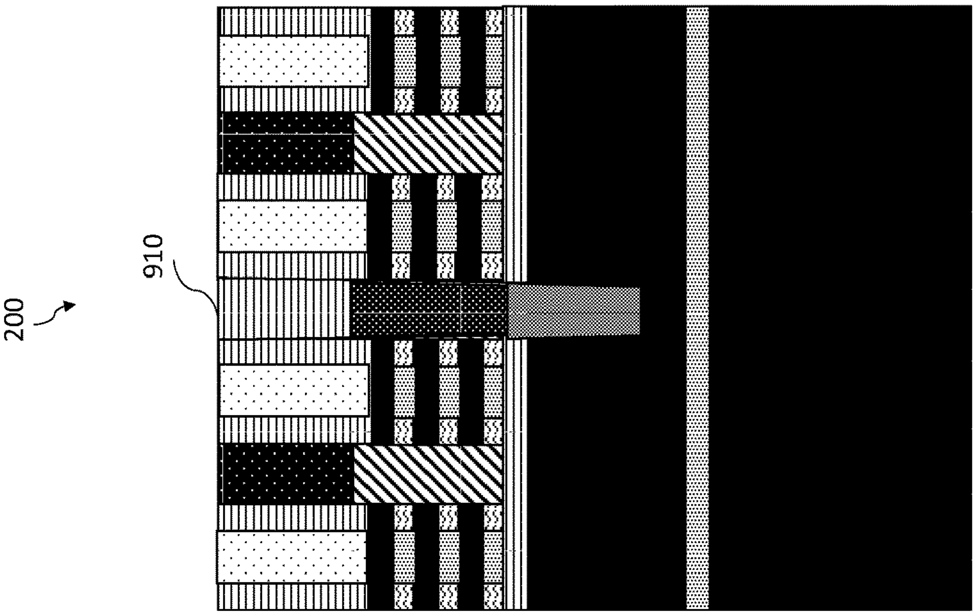

FIGS. 9A-9B illustrate side-views of a semiconductor device after the gate spacer fills the space, in accordance with some embodiments. In an embodiment, the remaining unfilled portions of the recess, i.e., above the new source/drain region, can be filled with the gate spacer 910. In some embodiments, the remaining unfilled portions of the recess can be filled with nitride. In several embodiments, the spacer formed over the new source/drain region can be used as a backside contact top cap.

Figure 10C:
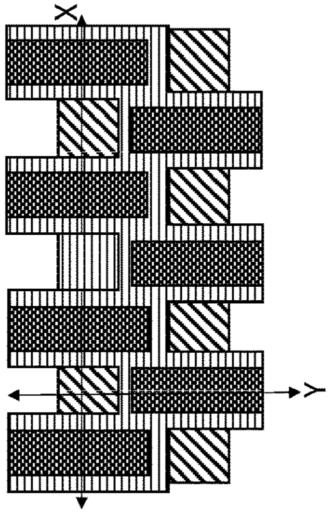
FIG. 10C depicts the side-view sections from which the semiconductor device is illustrated.
Figure 10B:
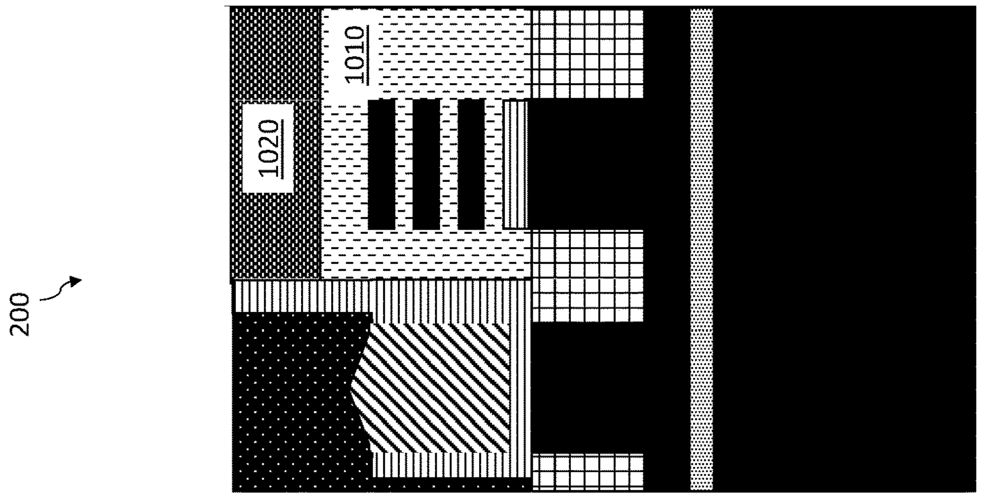
FIGS. 10A-10B illustrate side-views of a semiconductor device after the dummy gate removal and SAC formation, in accordance with some embodiments.
Figure 10A:
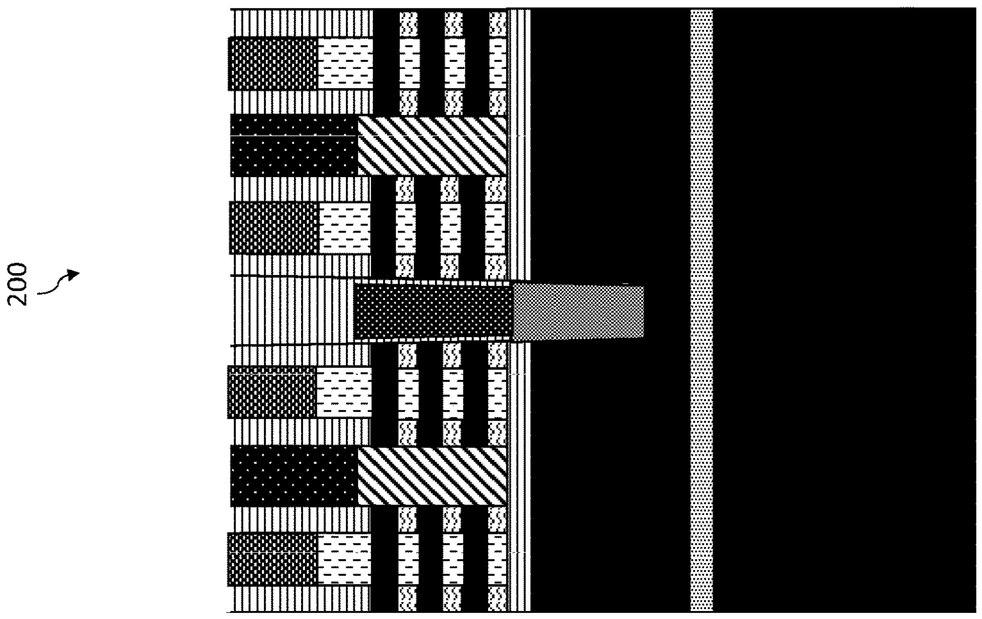

FIGS. 10A-10B illustrate side-views of a semiconductor device after the dummy gate is removed and SAC is formed, in accordance with some embodiments. In an embodiment, the dummy gate is removed, and the SiGe in the alternating layers of Si and SiGe is released. A replacement metal gate (RMG) process can be used to form a high-k metal gate region 1010. RMG can involve the replacement of the SiGe with a metal material, which can offer improved electrical performance and scalability. The metal gates can provide electrostatic control of the channel region, reduce leakage currents and improve the semiconductor device's performance. In some embodiments, the metal gates can further provide improved control over the work function and enable matching of threshold voltages and reduce semiconductor device variability. In some embodiments, the SAC 1020 is formed over the high-k metal gate region 1010. In an embodiment, the SAC 1020 is a thin dielectric layer, such as silicon dioxide (SiO2), and is deposited over the high-k metal gate region 1010.

Figure 11C:
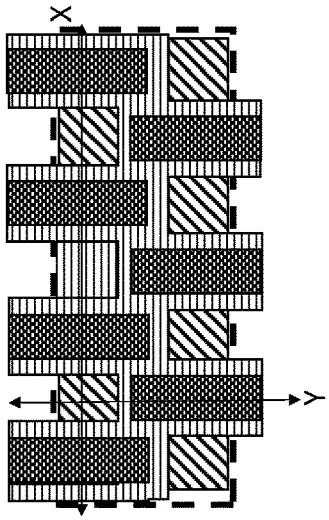
FIG. 11C depicts the side-view sections from which the semiconductor device is illustrated.
Figure 11B:
Figure 11A:
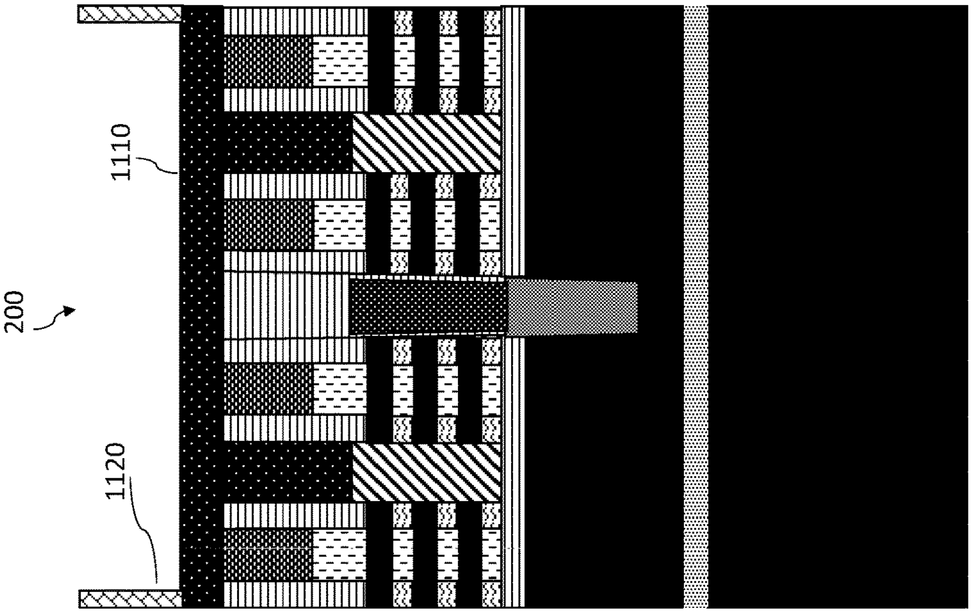

FIGS. 11A-11B illustrate side-views of a semiconductor device after the patterning of the contacts, in accordance with some embodiments. Once the RMG process is finished, the middle of the line (MOL) is performed. To that end, an ILD layer 1110 is formed over the semiconductor device 200, followed by forming thin layers of OPL 1120 over the edges of the semiconductor device 200.

Figure 12C:
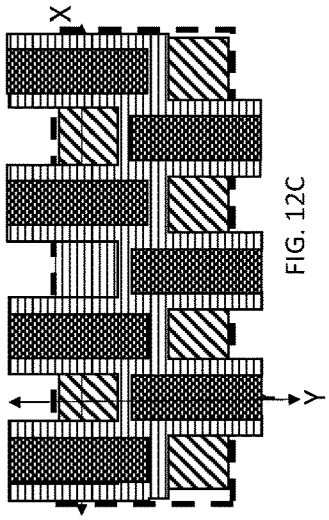
FIG. 12C depicts the side-view sections from which the semiconductor device is illustrated.
Figure 12B:
FIGS. 12A-12B illustrate side-views of a semiconductor device after the etching, in accordance with some embodiments.
Figure 12A:
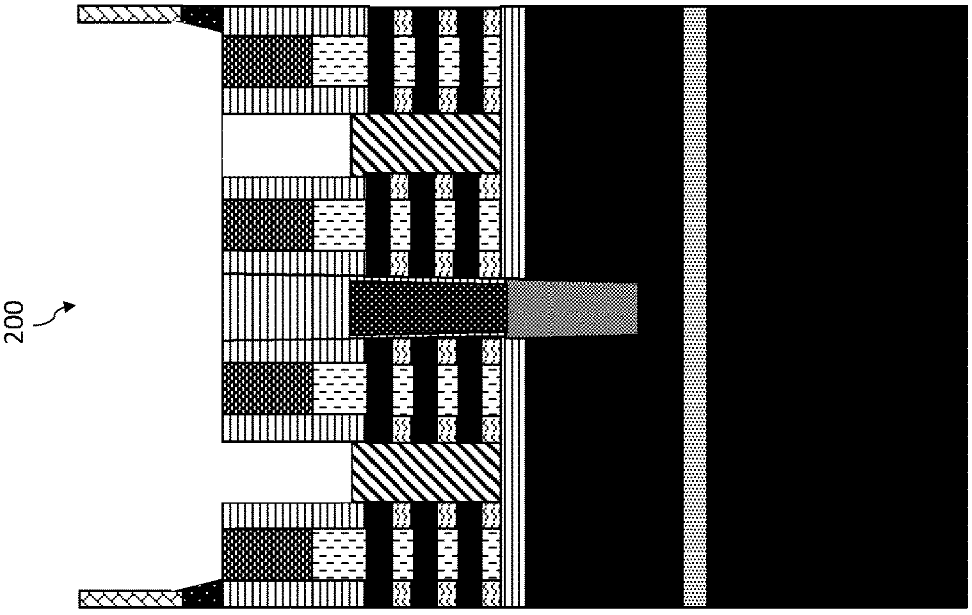

FIGS. 12A-12B illustrate side-views of a semiconductor device after the etching, in accordance with some embodiments. In some embodiments, portions of the ILD are removed, so new recesses over the second source/drain regions are formed. It should be noted that since the first source/drain region is covered by a layer of the gate spacer, and only the ILD is removed, then the first source/drain region remains covered by the gate spacer.

The recess can be formed by a reactive ion etching (RIE) technique. Generally, RIE is a dry etching process used in semiconductor device fabrication to remove materials from the surface of a substrate selectively. In some embodiments, RIE can involve the use of reactive ions and plasma to react with and remove specific materials chemically. In an embodiment, the RIE process begins by placing the semiconductor device 200 inside a vacuum chamber. The chamber is then evacuated to create a low-pressure environment. Reactive gases, which can consist of a combination of a chemically reactive gas and an inert gas, are introduced into the chamber. The chemically reactive gas, such as fluorine-based gases (e.g., CF4, SF6) or chlorine-based gases (e.g., C12), can react with the material to be etched, i.e., the second substrate, Si, while the inert gas, e.g., argon, can help to control the ion bombardment. In some embodiments, Radiofrequency or microwave power is applied to create a plasma within the chamber. In such embodiments, power excites the gas molecules, causing them to ionize and form a plasma of reactive ions and electrons. The plasma can include reactive ions that chemically react with the silicon. The reactive ions bombard the substrate surface, break chemical bonds and remove silicon. In various embodiments, the RIE process can be selective, meaning it can mainly affect the target material, i.e., silicon, while leaving other materials, such as masking layers or underlying layers, relatively unaffected. In some embodiments, to achieve selective etching, an etch mask can be applied on the substrate surface prior to the RIE process. The etch mask protects certain regions from etching, allowing the reactive ions to remove the exposed material selectively.

The etching process can be controlled to achieve specific etch profiles, such as vertical sidewalls or tapered structures. Parameters such as gas composition, pressure, power, and process duration are adjusted to achieve the desired etch characteristics. In some embodiments, endpoint detection techniques, such as optical emission spectroscopy or laser interferometry, can be used to determine when the etching process has reached a desired endpoint. This ensures accurate control of the etch depth and prevents over-etching. After the etching process is completed, the substrate can be cleaned to remove any residue or by-products from the etching. Cleaning can involve rinsing with solvents or plasma cleaning to ensure the substrate's surface is free from contaminants.

Figure 13C:
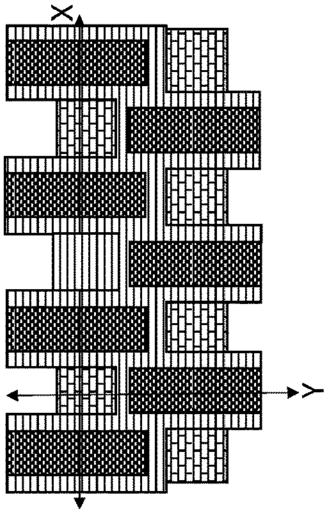
FIG. 13C depicts the side-view sections from which the semiconductor device is illustrated.
Figure 13B:
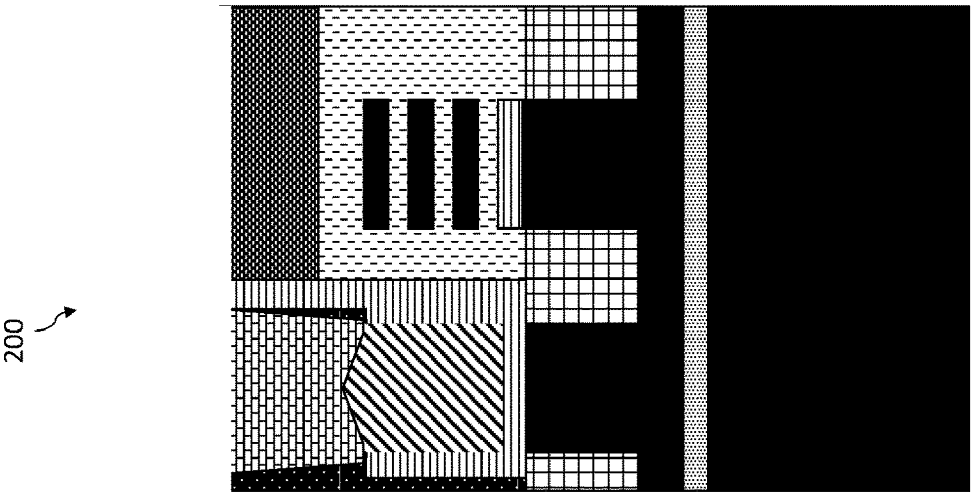
FIGS. 13A-13B illustrate side-views of a semiconductor device after the contact metallization, in accordance with some embodiments.
Figure 13A:
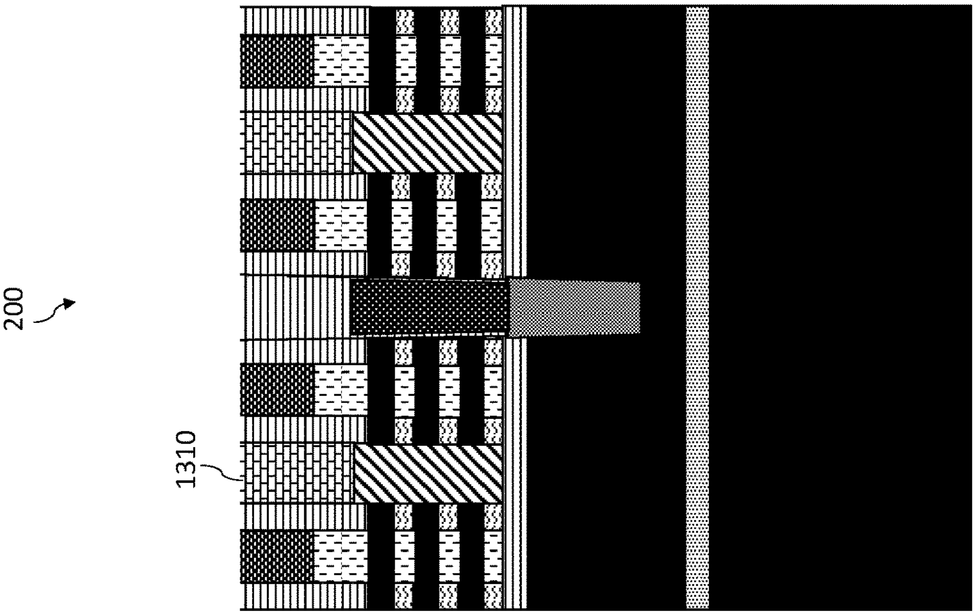

FIGS. 13A-13B illustrate side-views of a semiconductor device after the contact metallization, in accordance with some embodiments. In some embodiments, the contact metal 1310 is formed by a metal contact over the source/drain regions.

Figure 14C:
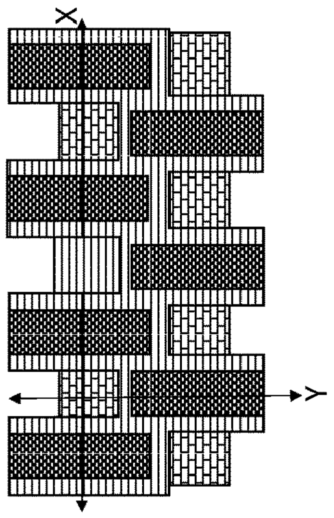
FIG. 14C depicts the side-view sections from which the semiconductor device is illustrated.
Figure 14B:
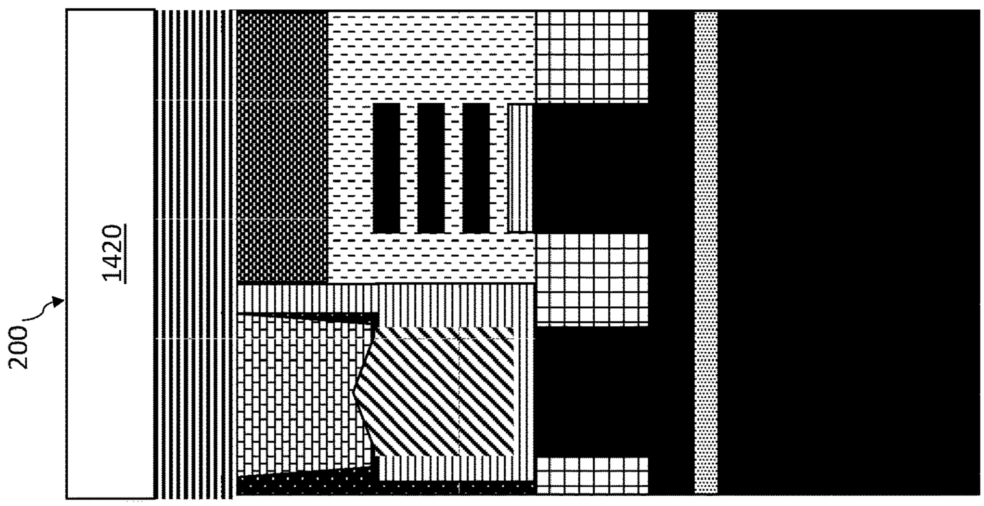
FIGS. 14A-14B illustrate side-views of a semiconductor device after the wafer bonding, in accordance with some embodiments.
Figure 14A:
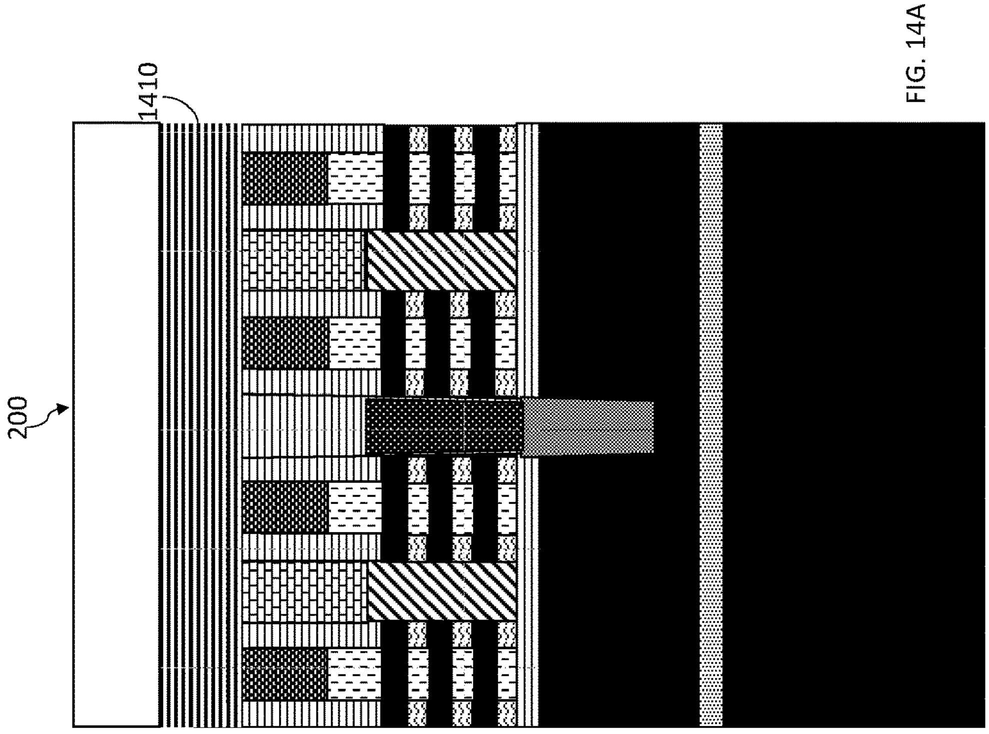

FIGS. 14A-14B illustrate side-views of a semiconductor device after the wafer bonding, in accordance with some embodiments. In some embodiments, the back end of line (BEOL) and wafer bonding are performed. In various embodiments, carrier wafer bonding, also known as wafer-to-wafer bonding or chip-to-wafer bonding, is performed to join two semiconductor devices together by creating a permanent bond between them. In some embodiments, the two semiconductor devices can be brought into contact and bonded at the atomic or molecular level, to create an interface. In an embodiment, the two semiconductor devices are brought into contact under controlled conditions, such as controlled pressure and temperature, to enable atomic or molecular bonding at the interface. Such bonding can be done at room temperature or with elevated temperatures. Alternatively, in some embodiments, an electric field and elevated temperature are utilized to create a bond. One semiconductor device can be made of semiconductor material, while the other can be a glass or silicon dioxide (SiO2) wafer. The electric field can cause ions in the glass or SiO2 to migrate and chemically bond with the semiconductor material in the other semiconductor device. In additional embodiments, a thin metal layer or metal alloy can be used as an intermediate bonding layer between the semiconductor devices. The metal layer 1410 can be deposited or transferred onto one or both semiconductor device surfaces, and the semiconductor devices can then be brought into contact and subjected to temperature and pressure to create a metallic bond 1420.

Figure 15C:
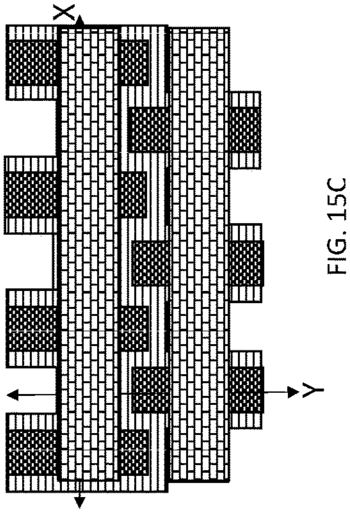
FIG. 15C depicts the side-view sections from which the semiconductor device is illustrated.
Figure 15B:
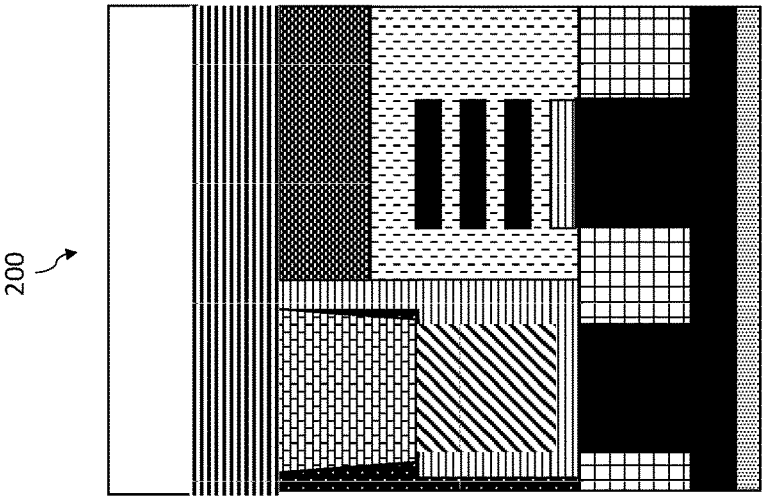
FIGS. 15A-15B illustrate side-views of a semiconductor device after the substrate removal, in accordance with some embodiments.
Figure 15A:
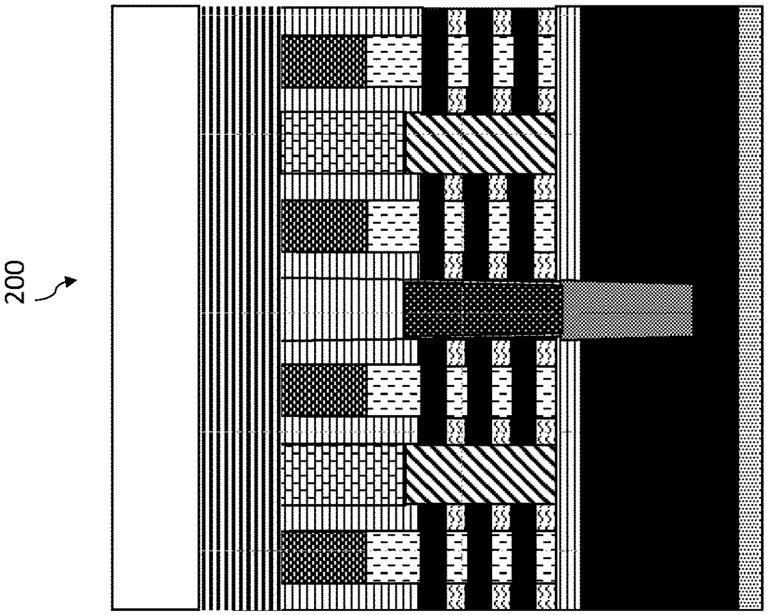

FIGS. 15A-15B illustrate side-views of a semiconductor device after the substrate is removed, in accordance with some embodiments. In some embodiments, the wafer is flipped, and the first substrate is removed. The first substrate removal process can proceed until reaching the etch stop layer. It should be noted that, for the sake of simplicity, the semiconductor device 200 is not shown are flipped.

Figure 16C:
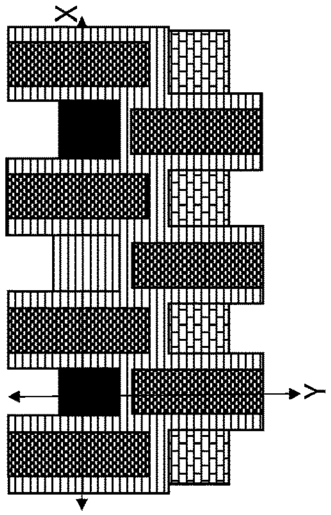
FIG. 16C depicts the side-view sections from which the semiconductor device is illustrated.
Figure 16B:
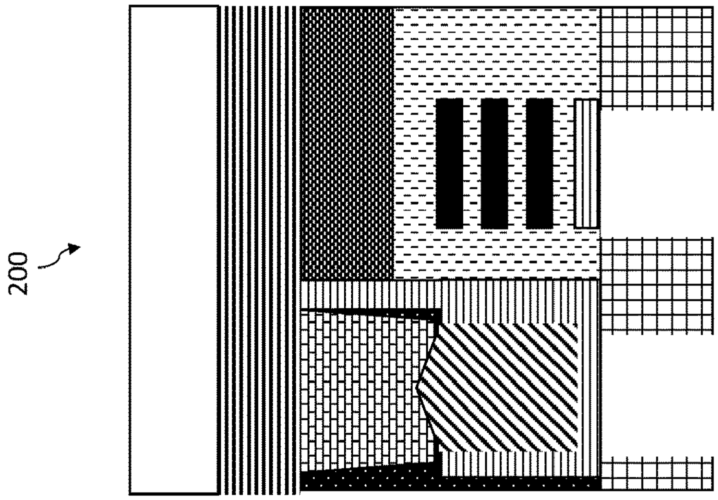
FIGS. 16A-16B illustrate side-views of a semiconductor device after the etch stop layer removal, in accordance with some embodiments.
Figure 16A:
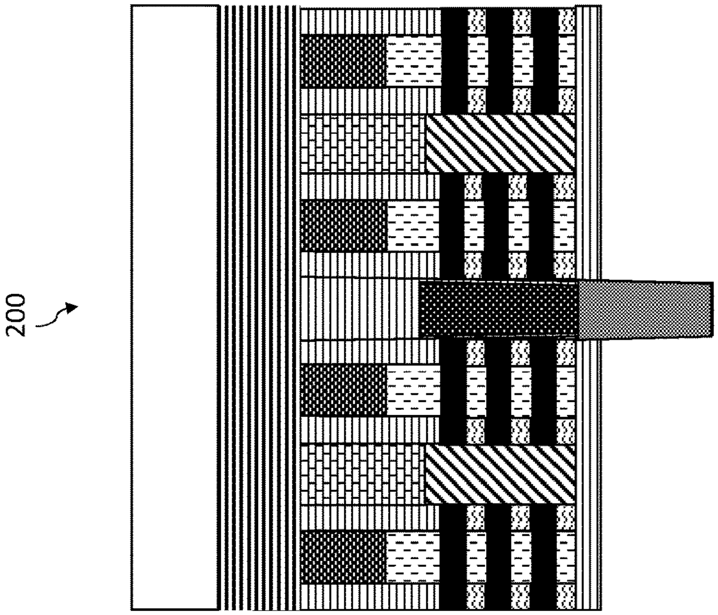

FIGS. 16A-16B illustrate side-views of a semiconductor device after the etch stop layer is removed, in accordance with some embodiments. In some embodiments, the etch stop layer is removed, followed by removing the remaining substrate, i.e., the second substrate.

Figure 17C:
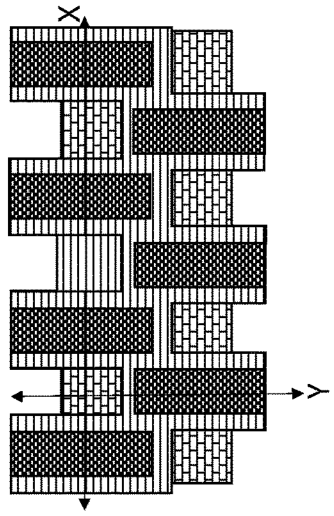
FIG. 17C depicts the side-view sections from which the semiconductor device is illustrated.
Figure 17B:
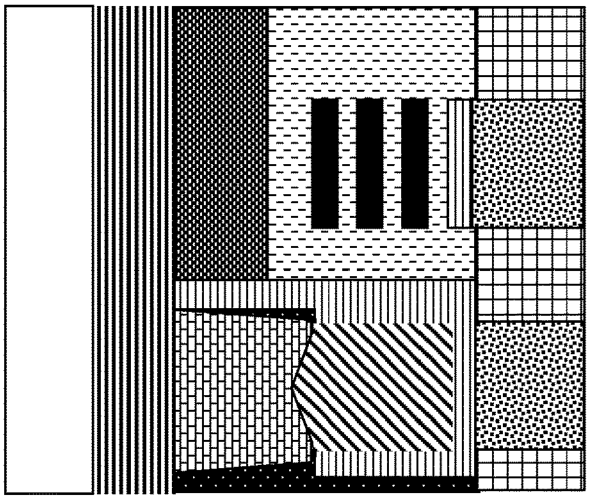
FIGS. 17A-17B illustrate side-views of a semiconductor device after the BILD deposition, in accordance with some embodiments.
Figure 17A:
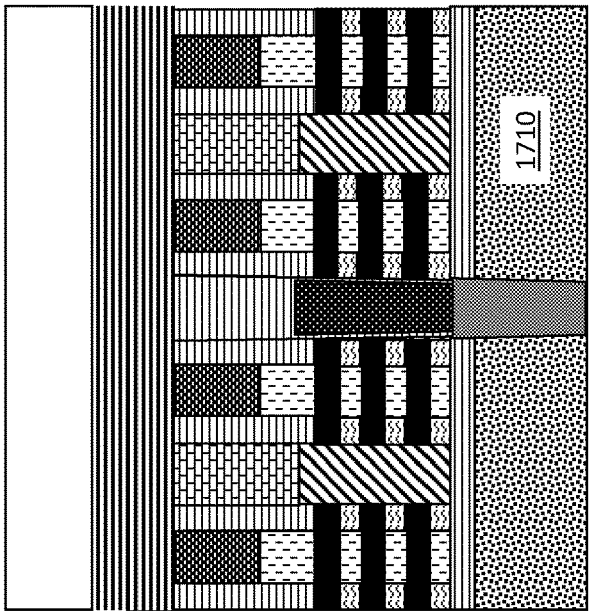

FIGS. 17A-17B illustrate side-views of a semiconductor device after the backside ILD is deposited, in accordance with some embodiments. In some embodiments, the backside ILD, BILD, 1710 is formed below the BDI, and surrounds the placeholder, and the STI. In an embodiment, a CMP process is further processed after the formation of the BILD 1710.

Figure 18C:
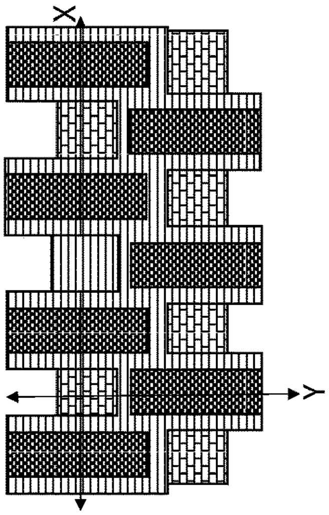
FIG. 18C depicts the side-view sections from which the semiconductor device is illustrated.
Figure 18B:
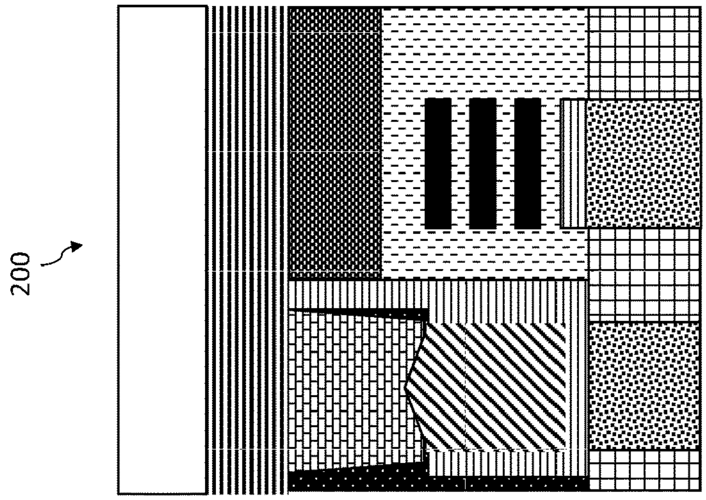
FIGS. 18A-18B illustrate side-views of a semiconductor device after the removal of the placeholder, in accordance with some embodiments.
Figure 18A:
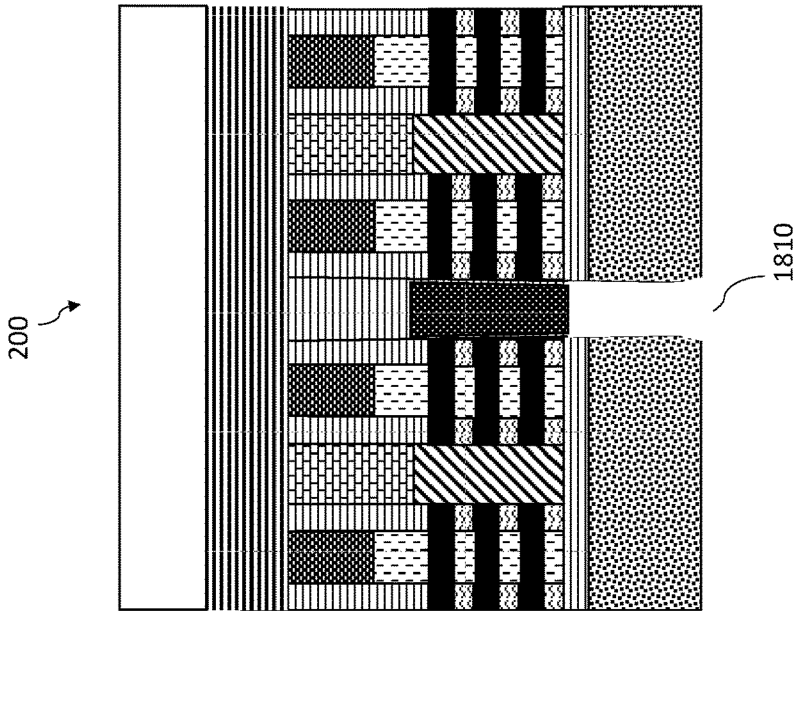

FIGS. 18A-18B illustrate side-views of a semiconductor device after the removal of the sacrificial placeholder, in accordance with some embodiments. In some embodiments, the placeholder can be removed so that a recess 1810 is formed that exposes the bottom of the first source/drain region.

Figure 19C:
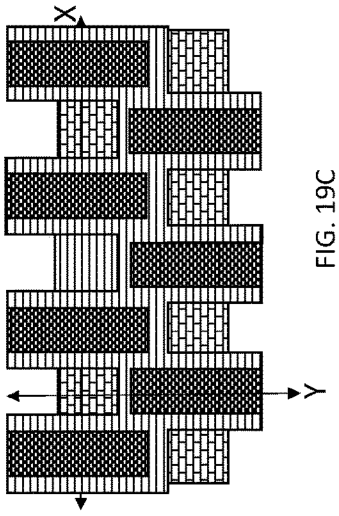
FIG. 19C depicts the side-view sections from which the semiconductor device is illustrated.
Figure 19B:
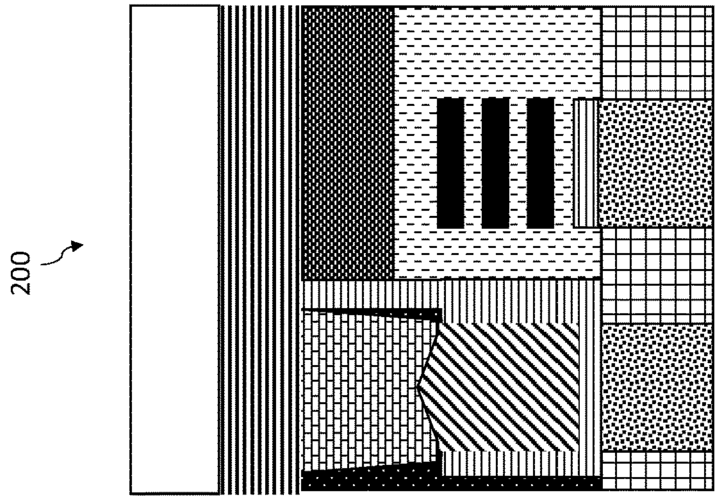
FIGS. 19A-19B illustrate side-views of a semiconductor device after the formation of the backside contact, in accordance with some embodiments.
Figure 19A:
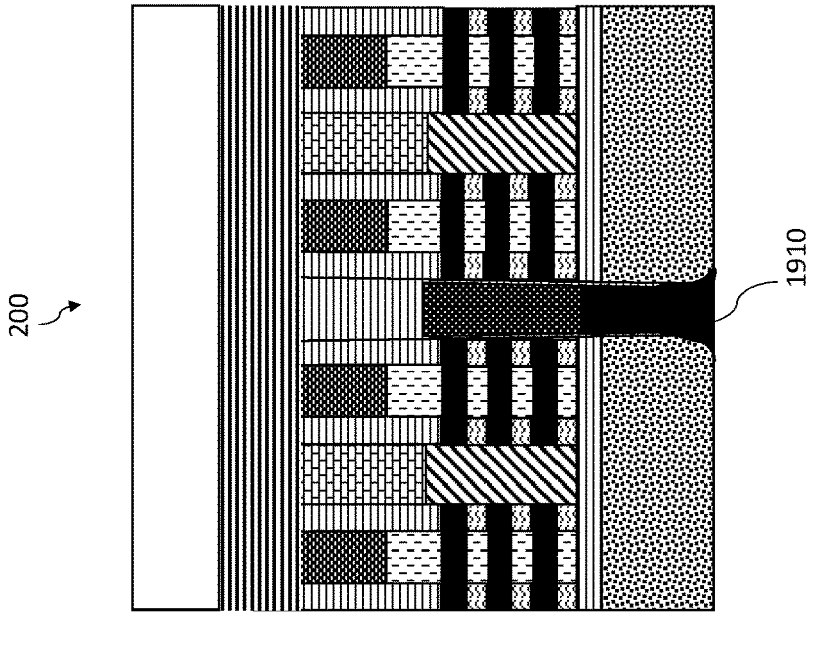

FIGS. 19A-19B illustrate side-views of a semiconductor device after the backside contact metallization, in accordance with some embodiments. In some embodiments, the BSCA 1910 is formed within the recess by filling by a metal contact.

Figure 20C:
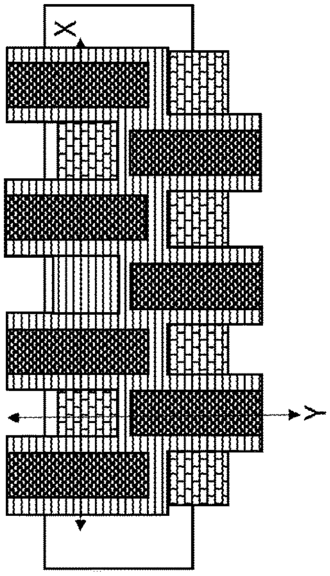
FIG. 20C depicts the side-view sections from which the semiconductor device is illustrated.
Figure 20B:
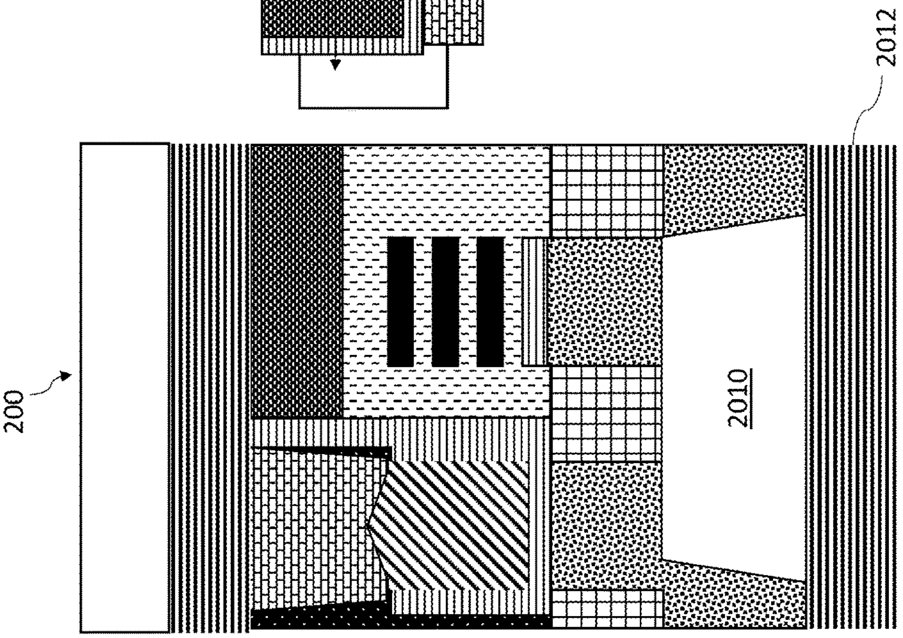
FIGS. 20A-20B illustrate side-views of a semiconductor device after the formation of the backside power rail, in accordance with some embodiments.
Figure 20A:
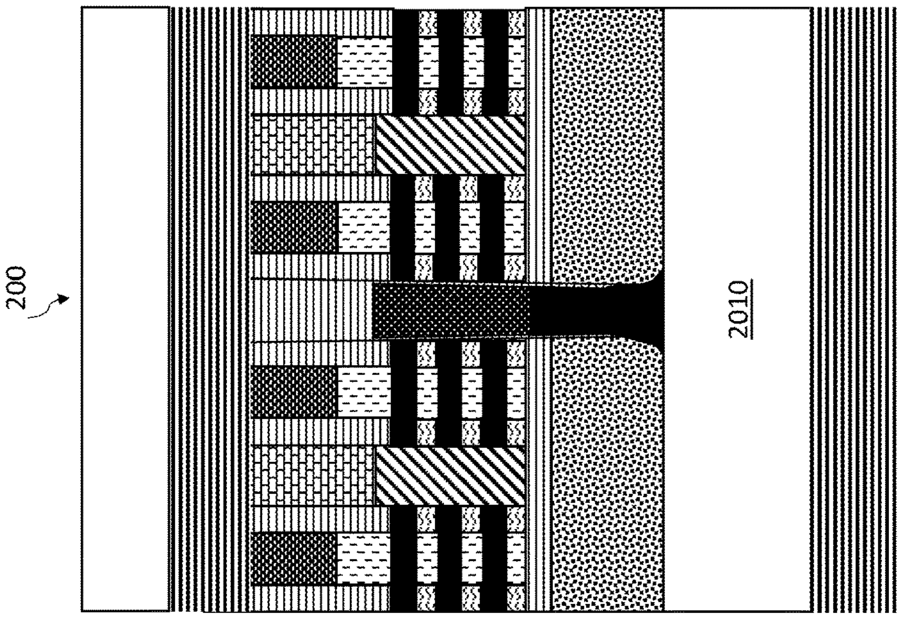

FIGS. 20A-20B illustrate side-views of a semiconductor device after the formation of the backside power rail, in accordance with some embodiments. In some embodiments, backside power rails, BSPR, 2010 is formed to cover the BSCA and the BILD. The BSPR 2010 can be used to create a power distribution network under the semiconductor device 200. Subsequently, a backside power delivery network, BDSPN, 2012 is formed below the BSPR 2010.

The BDSPN 2012 can distribute power on the backside of the substrate, thus, dissipating the heat generated by power dissipation away from the active components of the semiconductor device 200. In some embodiments, the BSPDN 2012 can help reduce power supply noise coupling and interference between different semiconductor devices, by separating the power distribution from the frontside circuitry and improving the signal integrity and noise immunity. Further, by separating the power distribution from the frontside signal paths, the BSPDN 2012 can help reduce cross-talk and interference between power and signal traces.

Figure 21A:
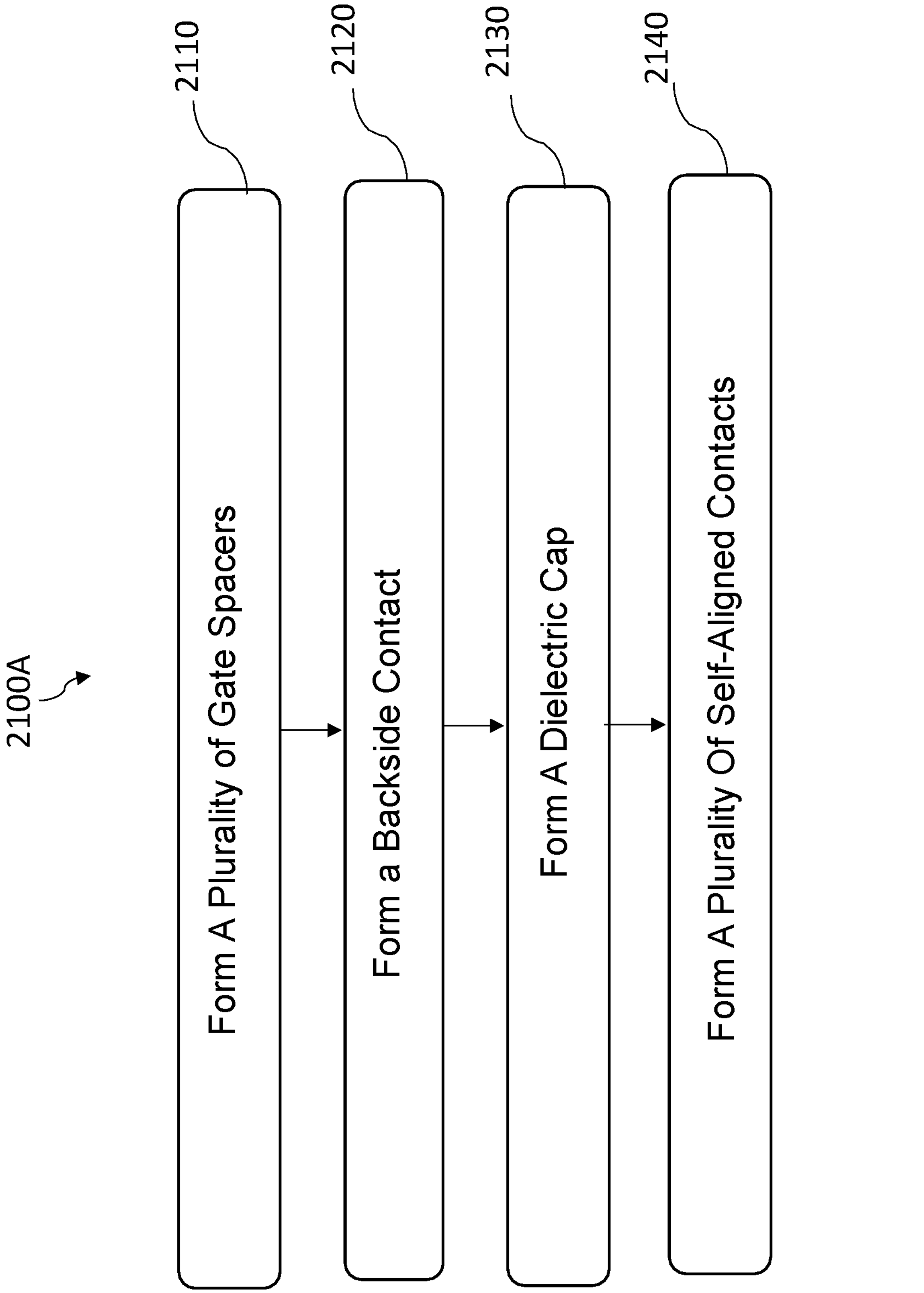
FIGS. 21A-21B illustrate block diagrams of a method for forming the semiconductor device, in accordance with some embodiments.
Figure 21B:
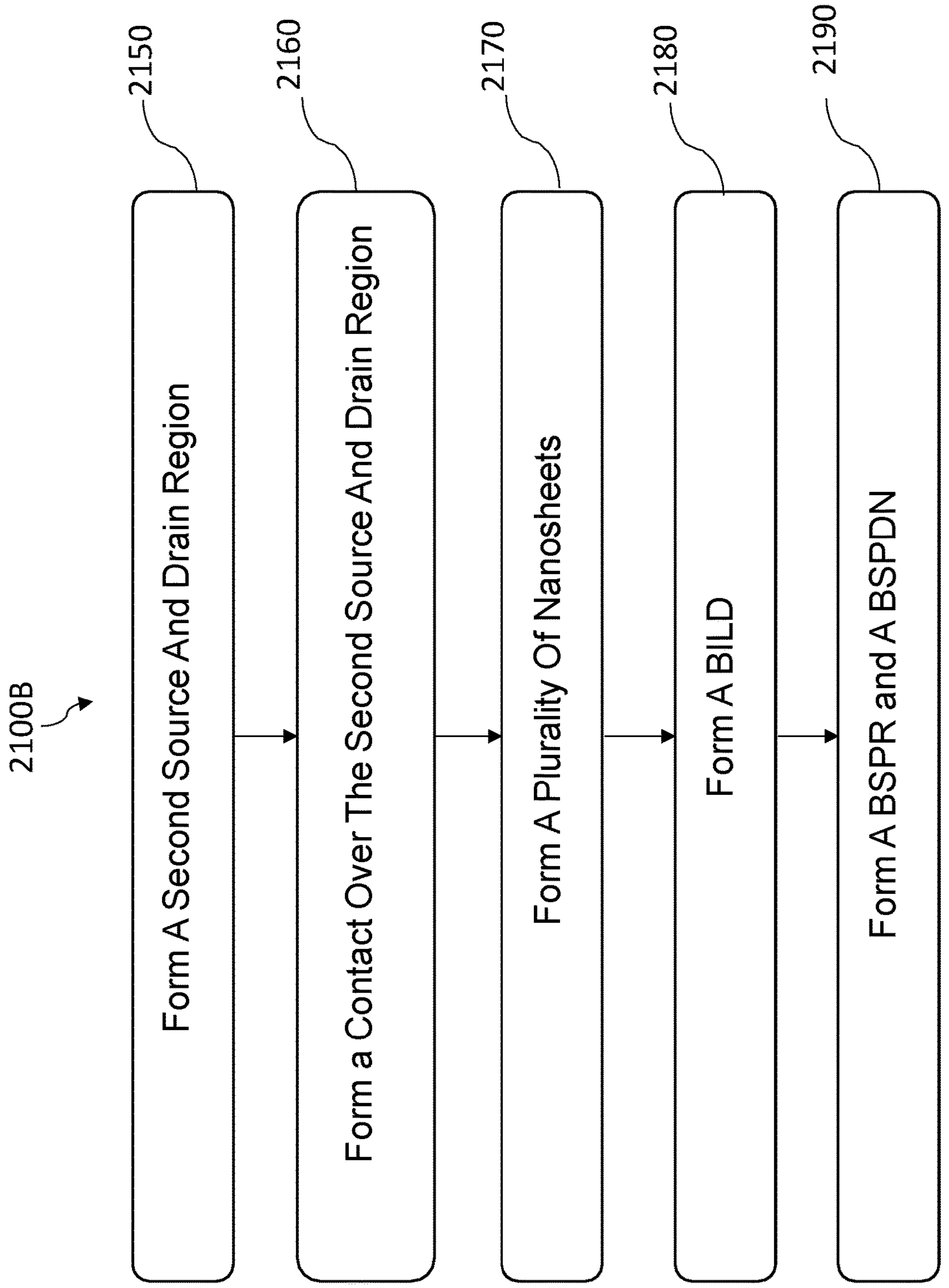

FIGS. 21A-21B illustrate block diagrams of a method 2100A for forming the semiconductor device, in accordance with some embodiments. Referring to FIG. 21A now, the method 2100A can begin when a plurality of gate caps are formed, as shown by block 2110. The plurality of gate caps can be formed over a plurality of gate regions. In some embodiments, the plurality of gate regions is formed in a staggered configuration.

In an embodiment, the method 2100A proceeds when a plurality of gate spacers is formed, as shown by block 2120. In some embodiments, the plurality of gate caps can be made of the same materials as the plurality of gate spacers. The plurality of gate spacers can be formed over the sidewalls of the plurality of gate regions and the plurality of gate caps.

In some embodiments, the method 2100A continues when a backside contact is formed, as shown by block 2130. The backside contact can be formed under a first source and drain region. The first source and drain region can be located between two adjacent gate regions of the plurality of gate regions.

In some embodiments, the method 2100A continues when a dielectric cap is formed over the first source and drain region, as shown by block 2140.

Referring to FIG. 2100B now, a method 2100B for forming the semiconductor device, is shown. The method 2100B can begin when a second source and drain region is formed, as shown by block 2150.

The method 2100B can proceed when a contact over the second source and drain region is formed, as shown by block 2160. The contact can be surrounded by the gate spacers.

The method 2100B can continue when a plurality of nanosheet gates extended between the first and second source and drain regions is formed, as shown by block 2170.

The method 2100B proceeds when a backside interlayer dielectric (BILD) is formed, as shown by block 2180. The BILD can be located under a bottom dielectric isolation (BDI). The method 2100 can continue when a backside power rail (BSPR) is formed over a backside power delivery network (BSPDN), as shown by block 2190.

In one aspect, the method and structures described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip may be mounted in a single chip package (such as a plastic carrier, with leads that are affixed to a motherboard or other higher-level carrier) or in a multichip package (such as a ceramic carrier that has either or both surface interconnections or buried interconnections). In any case, the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications, such as toys, to advanced computer products having a display, a keyboard or other input device, and a central processor.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications, and variations that fall within the true scope of the present teachings.

The components, steps, features, objects, benefits, and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, the inventive subject matter lies in less than all features of a single disclosed embodiment. Thus, the following claims are hereby incorporated into the Detailed Description, with each claim standing on its own as a separately claimed subject matter.

What is claimed is:

1. A semiconductor device, the semiconductor device comprising:

a plurality of gate caps over a plurality of gate regions;

a plurality of source/drain regions;

gate spacers over sidewalls of the plurality of gate regions and the plurality of gate caps, wherein the plurality of gate regions is so arranged in a staggered arrangement that there is an overlap region between each two adjacent gate regions of the plurality of gate regions, and the gate spacers pinch off the overlap region;

a backside contact under a first source/drain region of the plurality of source/drain regions, wherein the first source and drain region is located between two adjacent gate regions of the plurality of gate regions; and a dielectric cap over the first source and drain region.

2. The semiconductor device of claim 1, further comprising:

the dielectric cap is made of a same material as the plurality of gate caps and the gate spacers.

3. The semiconductor device of claim 1, further comprising:

a source/drain contact above each of the plurality of source/drain regions, wherein the source/drain contact is surrounded by an interlayer dielectric layer (ILD).

4. The semiconductor device of claim 3, wherein the dielectric cap and the ILD are made of different materials.

5. The semiconductor device of claim 1, wherein:

the first source/drain region and a second source/drain region of the plurality of source/drain regions are isolated from the plurality of gate caps by the gate spacers.

6. The semiconductor device of claim 1, further comprising:

a second source/drain region of the plurality of source/drain regions; and a plurality of nanosheet gates extended between the first and second source and drain regions.

7. The semiconductor device of claim 1, further comprising:

a backside interlayer dielectric (BILD) located under a backend dielectric layer (BDI), and a backside power rail (BSPR) over a backside power delivery network (BSPDN).

8. The semiconductor device of claim 7, wherein:

the backside contact is surrounded by the BILD, the BSPR, the BDI, and the first source and drain region.

9. A method for forming a semiconductor device, the method comprising:

forming a plurality of gate caps over a plurality of gate regions;

forming a plurality of source/drain regions;

forming gate spacers over sidewalls of the plurality of gate regions and the plurality of gate caps, wherein the plurality of gate regions is so arranged in a staggered arrangement that there is an overlap region between each two adjacent gate regions of the plurality of gate regions. wherein the gate spacers pinch off the overlap region;

forming a backside contact under a first source/drain region of the plurality of source/drain regions, wherein the first source and drain region is located between two adjacent gate regions of the plurality of gate regions; and forming a dielectric cap over the first source and drain region.

10. The method of claim 9, wherein:

the dielectric cap is made of a same material as the plurality of gate caps and the gate spacers.

11. The method of claim 9, further comprising:

forming a source/drain contact above each of the plurality of source/drain regions, wherein the source/drain contact is surrounded by an interlayer dielectric layer (ILD).

12. The method of claim 11, wherein the dielectric cap and the ILD are made of different materials.

13. The method of claim 9, further comprising:

forming a plurality of nanosheet gates extended between the first source/drain region and a second source/drain region of the plurality of source/drain regions.

14. The method of claim 9, wherein:

the first source/drain region and a second source/drain region of the plurality of source/drain regions are isolated from the plurality of gate caps by the gate spacers.

15. The method of claim 9, further comprising:

forming a backside interlayer dielectric (BILD) located under a backend dielectric isolation (BDI), and forming a backside power rail (BSPR) over a backside power delivery network (BSPDN).

16. The method of claim 15, wherein: the backside contact is surrounded by the BILD, the BSPR, the BDI, and the first source and drain region.

17. A semiconductor device, comprising:

a plurality of nanosheet gates located between a first and second source and drain regions;

a backside contact under the first source and drain region;

gate spacers over sidewalls of a gate region of each of the plurality of nanosheet gates, wherein the plurality of nanosheet gates is so arranged in a staggered arrangement that there is an overlap region between each two adjacent nanosheet gates of the plurality of nanosheet gates, and the gate spacers pinch off the overlap region a dielectric cap located over the source and drain region, wherein:

the backside contact is surrounded by a backside interlayer dielectric (BILD), a backside power rail (BSPR), and a backend dielectric isolation (BDI).

18. The semiconductor of claim 17, further comprising:

a gate cap over the gate region of each of the plurality of nanosheet gates.

* * * * *